(12) United States Patent
Lee et al.

(10) Patent No.: US 9,806,013 B2
(45) Date of Patent: Oct. 31, 2017

(54) MULTILAYER STRUCTURE FOR A SEMICONDUCTOR DEVICE AND A METHOD OF FORMING A MULTILAYER STRUCTURE FOR A SEMICONDUCTOR DEVICE

(71) Applicant: Institute of Technical Education, Singapore (SG)

(72) Inventors: Teck Kheng Lee, Singapore (SG); Bok Leng Ser, Singapore (SG)

(73) Assignee: Institute of Technical Education, Singapore (SG)

( * ) Notice: Subject to any disclaimer, the term of this patent is extended or adjusted under 35 U.S.C. 154(b) by 111 days.

(21) Appl. No.: 14/914,775

(22) PCT Filed: Aug. 28, 2013

(86) PCT No.: PCT/SG2013/000374
§ 371 (c)(1),
(2) Date: Feb. 26, 2016

(87) PCT Pub. No.: WO2015/030670
PCT Pub. Date: Mar. 5, 2015

(65) Prior Publication Data
US 2016/0211206 A1    Jul. 21, 2016

(51) Int. Cl.
*H01L 23/498*    (2006.01)
*H01L 21/48*    (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ......... H01L 23/49838; H01L 23/49811; H01L 23/49822; H01L 21/4853; H01L 21/4857;
(Continued)

(56) References Cited

U.S. PATENT DOCUMENTS 4,914,056 A * 4/1990 Okumura .......... H01L 21/76885
257/773
5,229,257 A * 7/1993 Cronin .............. H01L 21/76807
257/E21.579
(Continued)

OTHER PUBLICATIONS

Written Opinion corresponding to PCT/SG2013/000374, dated May 9, 2016, seven pages.

*Primary Examiner* — Roy Potter
(74) *Attorney, Agent, or Firm* — Kilpatrick Townsend & Stockton LLP

(57) ABSTRACT

A multilayer structure for a semiconductor device and a method of forming a multilayer structure for a semiconductor device. The multilayer structure comprises: a substrate having an electrically conductive portion thereon; a dielectric layer formed over the substrate; the dielectric layer comprising an opening over at least part of the electrically conductive portion; and a conductive pillar formed on the at least part of the electrically conductive portion; wherein the conductive pillar comprises walls defined by at least the opening of the dielectric layer and an opening of a patterned layer.

35 Claims, 20 Drawing Sheets

(51) Int. Cl.
*H01L 23/00* (2006.01)
*H01L 23/31* (2006.01)
*H01L 23/525* (2006.01)

(52) U.S. Cl.
CPC .... *H01L 23/3192* (2013.01); *H01L 23/49811* (2013.01); *H01L 23/49822* (2013.01); *H01L 24/03* (2013.01); *H01L 24/05* (2013.01); *H01L 24/11* (2013.01); *H01L 24/14* (2013.01); *H01L 23/525* (2013.01); *H01L 24/13* (2013.01); *H01L 2224/02333* (2013.01); *H01L 2224/03462* (2013.01); *H01L 2224/0401* (2013.01); *H01L 2224/05008* (2013.01); *H01L 2224/05009* (2013.01); *H01L 2224/05022* (2013.01); *H01L 2224/05124* (2013.01); *H01L 2224/05139* (2013.01); *H01L 2224/05144* (2013.01); *H01L 2224/05147* (2013.01); *H01L 2224/05164* (2013.01); *H01L 2224/05166* (2013.01); *H01L 2224/05548* (2013.01); *H01L 2224/05567* (2013.01); *H01L 2224/05569* (2013.01); *H01L 2224/05572* (2013.01); *H01L 2224/05624* (2013.01); *H01L 2224/05639* (2013.01); *H01L 2224/05644* (2013.01); *H01L 2224/05647* (2013.01); *H01L 2224/05664* (2013.01); *H01L 2224/05666* (2013.01); *H01L 2224/1134* (2013.01); *H01L 2224/11462* (2013.01); *H01L 2224/11472* (2013.01); *H01L 2224/11849* (2013.01); *H01L 2224/13022* (2013.01); *H01L 2224/13024* (2013.01); *H01L 2224/13082* (2013.01); *H01L 2224/13111* (2013.01); *H01L 2224/13139* (2013.01); *H01L 2224/13144* (2013.01); *H01L 2224/13147* (2013.01); *H01L 2224/13193* (2013.01); *H01L 2224/1403* (2013.01); *H01L 2224/14051* (2013.01); *H01L 2224/16238* (2013.01)

(58) Field of Classification Search
CPC ........... H01L 2924/01013; H01L 24/13; H01L 2224/0401
See application file for complete search history.

(56) References Cited

U.S. PATENT DOCUMENTS

| | | |
|---|---|---|
| 6,911,386 B1 | 6/2005 | Lee et al. |
| 7,989,953 B1 | 8/2011 | Jergovic |
| 8,058,163 B2 | 11/2011 | Reche et al. |
| 2002/0173073 A1 | 11/2002 | Liang et al. |
| 2006/0003586 A1* | 1/2006 | Raghuram ........ H01L 21/31055 438/690 |
| 2007/0079986 A1 | 4/2007 | Kikuchi et al. |
| 2008/0169558 A1 | 7/2008 | Lu |
| 2009/0026614 A1 | 1/2009 | Jung |
| 2010/0264538 A1* | 10/2010 | Swinnen ................ H01L 23/481 257/737 |
| 2011/0312128 A1 | 12/2011 | Kim et al. |

* cited by examiner

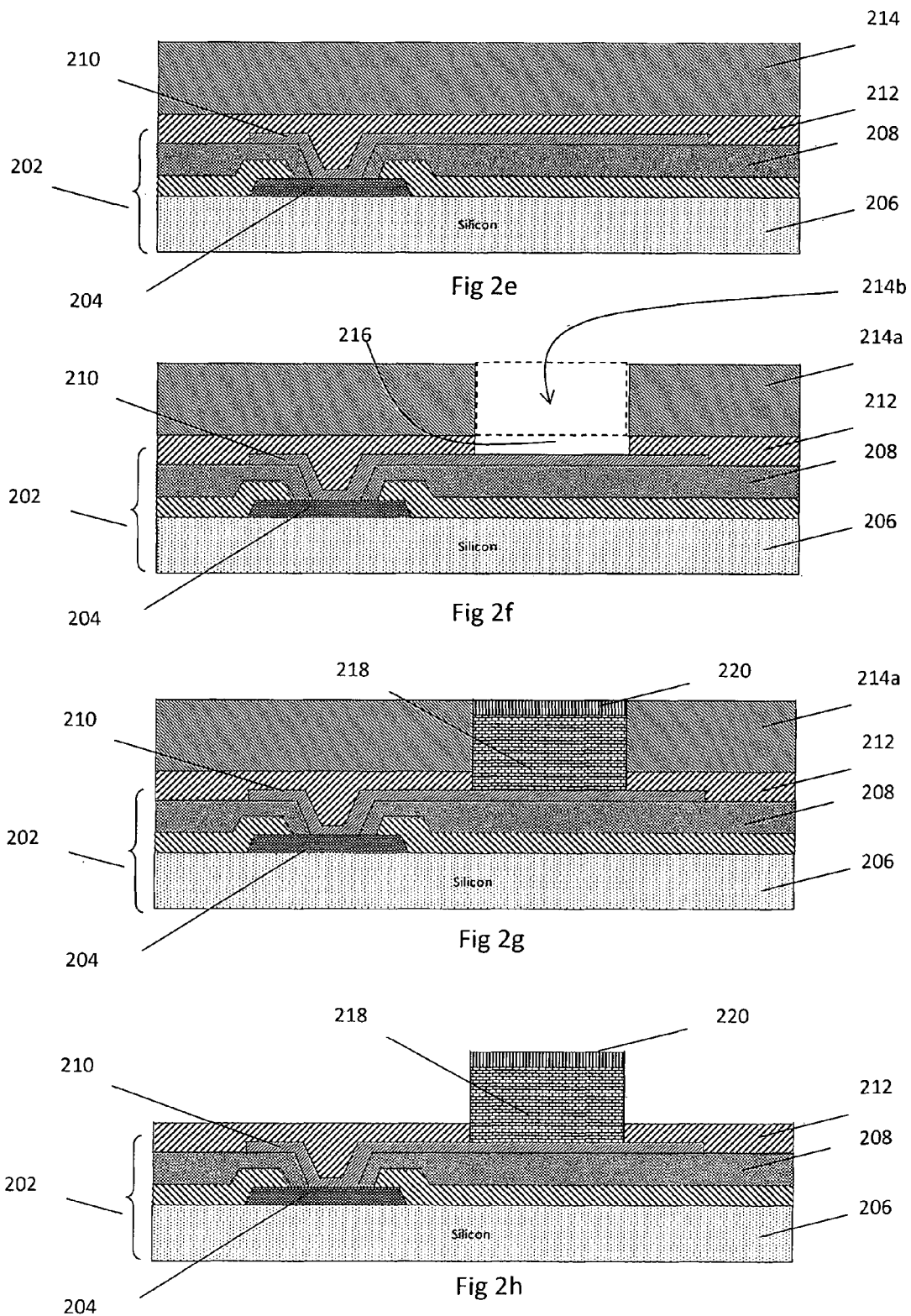

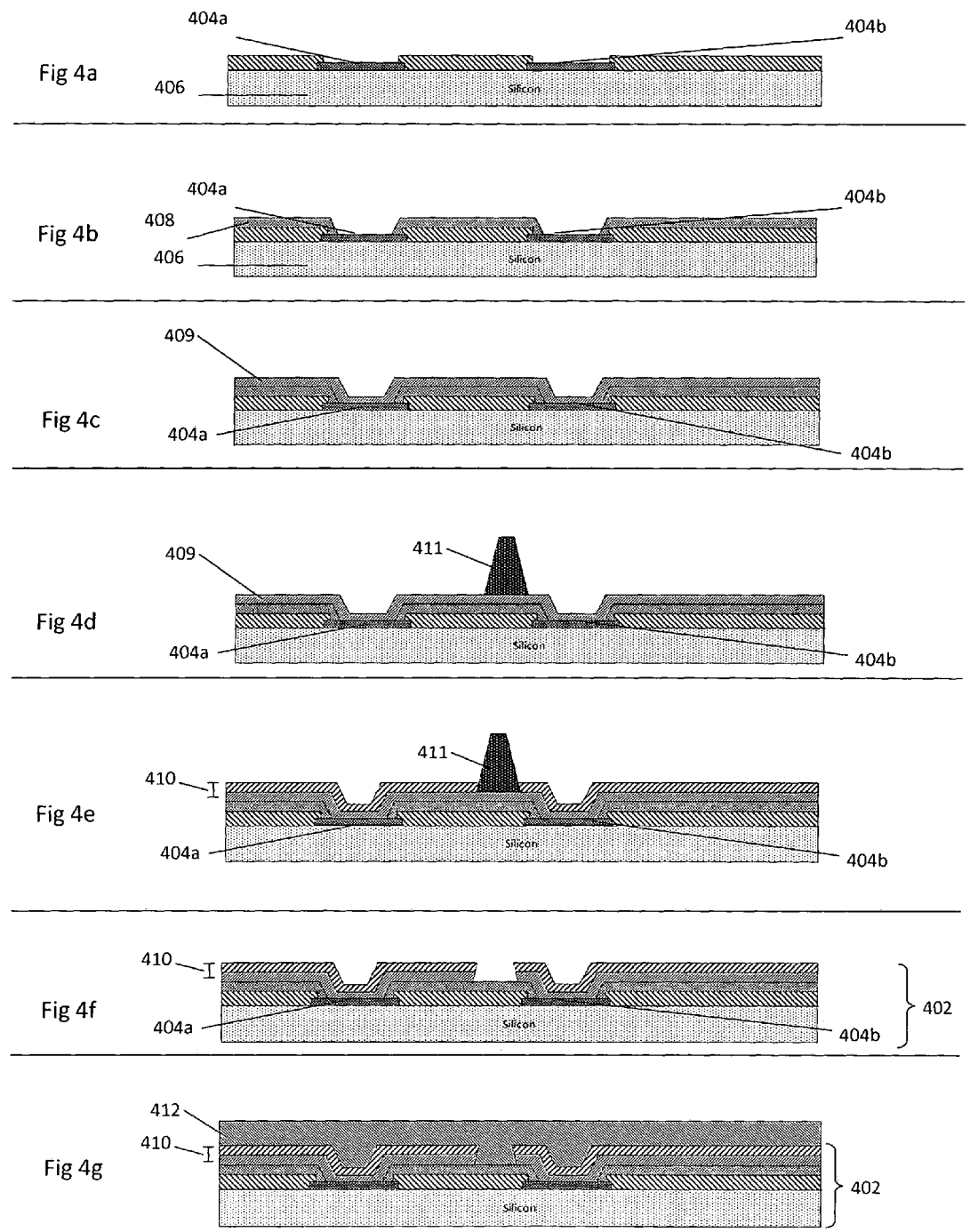

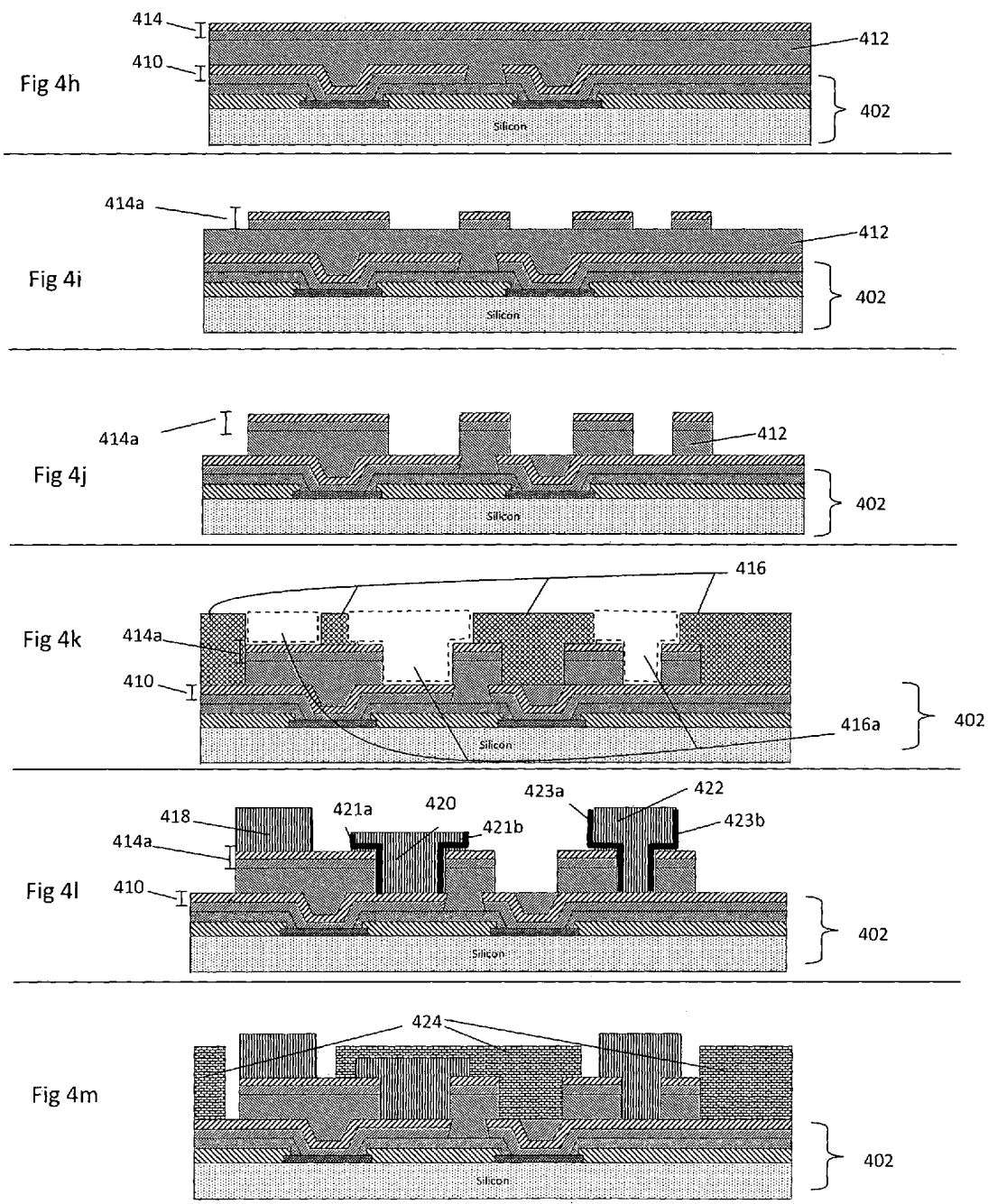

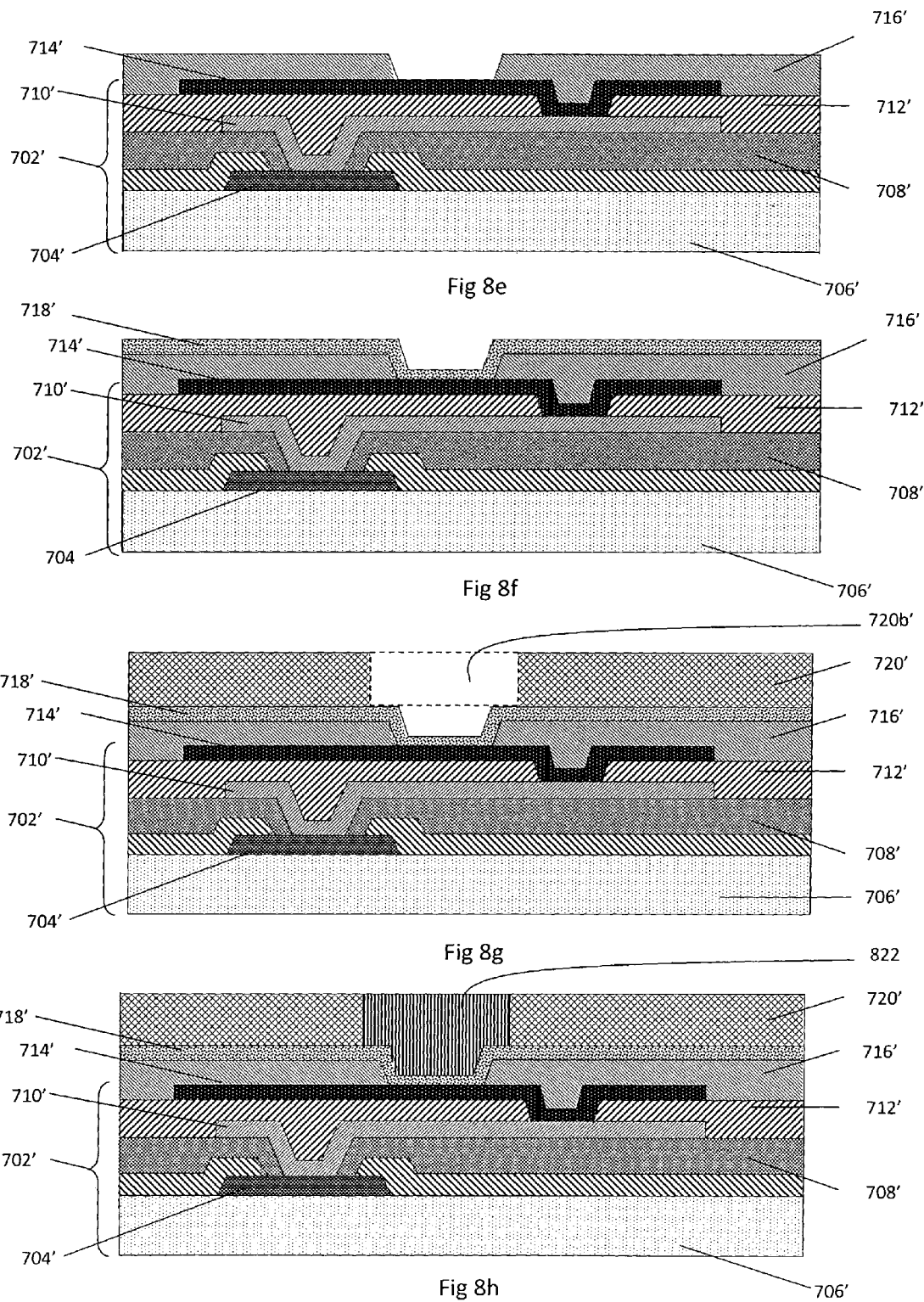

MULTILAYER STRUCTURE FOR A SEMICONDUCTOR DEVICE AND A METHOD OF FORMING A MULTILAYER STRUCTURE FOR A SEMICONDUCTOR DEVICE

TECHNICAL FIELD

The present disclosure relates broadly to a multilayer structure for a semiconductor device, and a method of forming a multilayer structure for a semiconductor device.

BACKGROUND

The electronics industry is nearing the limits of traditional CMOS (Complementary Metal Oxide) scaling. As traditional Moore's law scaling becomes more difficult, assembly and packaging innovations have enabled continued advances in the electronics industry, by e.g. enabling functional diversification of CMOS integrated circuits and by allowing scaling in the third dimension.

In order to maintain the desired progress in electronics manufacturing, continued increases in functional density and cost per function can be achieved through innovative assembly and packaging-methods.

Wafer level packaging (WLP) is among the innovative approaches to reduce cost and achieve other advantages similar to those obtained from the scaling of front end processes.

Bond or contact pads are formed and exposed on the surfaces of integrated circuit chips where electrical connections are made through the contact pads to connect the chip to a package substrate or to another chip, using wire bonding or flip-chip bonding technologies. Flip chip technologies uses bumps such as C4 (controlled collapse chip connection) or copper pillar bump as the interconnect, and these bumps are formed at the wafer level.

Typically, the formation of bumps requires the use of UBM (under bump metal). That is, the bumps are formed by the electroplating of a seed layer which was previously sputtered on the e.g. substrate. However, during the stripping of the seed layer to leave only the UBM, portions which the bump is formed thereon may be undercut, resulting in potential reliability issues.

In addition, the size of the UBM is typically required to be bigger than the via or opening below it, in order for mechanical alignment mismatches to be better tolerated. Hence, the shrinking of the bump size is restricted by presence of the UBM. This will limit the potential for finer pitches.

Further, the adhesion of UBM to underlying dielectric layers is typically weak and can result in further reliability issues.

The formation of the UBM also requires additional process steps and would require additional equipment such as photo masks. This would incur additional costs, to the wafer fabrication process and also increases process time and reduces throughput.

Thus, there exists a need for an integrated circuit structure, and a method of forming an integrated circuit structure that address or at least ameliorate one or more of the problems described above.

SUMMARY

In accordance with one aspect, there is provided a multilayer structure for a semiconductor device, the multilayer structure comprising: a substrate having an electrically conductive portion thereon; a dielectric layer formed over the substrate; the dielectric layer comprising an opening over at least part of the electrically conductive portion; and a conductive pillar formed on the at least part of the electrically conductive portion; wherein the conductive pillar comprises walls defined by at least the opening of the dielectric layer and an opening of a patterned layer.

In one embodiment, the opening of the patterned layer is substantially aligned with the opening of the dielectric layer.

In one embodiment, the patterned layer comprises a resist layer.

In one embodiment, the patterned layer is a layer that has been removed.

In one embodiment, the patterned layer comprises a metal layer, such that said conductive pillar conductively connects the electrically conductive portion of the substrate to the metal layer.

In one embodiment, the patterned layer further comprises a resist layer.

In one embodiment, the resist layer has been removed.

In one embodiment, a solder layer is formed over the conductive pillar.

In one embodiment, the electrically conductive portion comprises a redistribution layer that is conductively connected to a contact pad.

In one embodiment, the walls of the conductive pillar are substantially straight.

In one embodiment, the electrically conductive portion comprises a contact pad.

In one embodiment, the conductive pillar comprises an electroplated metal that is electroplated from the electrically conductive portion:

In one embodiment, the conductive pillar formed on the at least part of the electrically conductive portion comprises a bump-in-via structure.

In one embodiment, the substrate comprises a wafer.

In one embodiment, the multilayer structure further comprises a package substrate coupled to the conductive pillar.

In one embodiment, a width of the pillar is 50 microns or less.

In one embodiment, the multilayer structure comprises an integrated circuit structure.

In one embodiment, the multilayer structure comprises an interposer.

In accordance with another aspect, there is provided a method of forming a multilayer structure for a semiconductor device, the method comprising: i) providing a construct comprising: a substrate having an electrically conductive portion thereon; a dielectric layer that is formed over the substrate; an opening in said dielectric layer that is formed over at least part of the electrically conductive portion; and a patterned layer that is formed over the dielectric layer; and ii) forming a conductive pillar on the at least part of the electrically conductive portion, such that the walls of the conductive pillar are defined by the opening of the dielectric layer and an opening of the patterned layer.

In one embodiment, the walls of the conductive pillar are substantially straight.

In one embodiment, the step of providing the construct comprises: forming the substrate having the electrically conductive portion thereon depositing the dielectric layer over the substrate; introducing the patterned layer over the dielectric layer; and etching a portion of the dielectric layer to form the opening over the at least part of the electrically conductive portion.

In one embodiment, the step of depositing the dielectric layer over the substrate comprises coating the dielectric layer on the substrate.

In one embodiment, the step of introducing the patterned layer comprises: depositing a resist layer on the dielectric layer; and patterning the resist layer through a selective etching process to form the opening of the patterned layer.

In one embodiment, the steps from introducing the patterned layer and to etching a portion of the dielectric layer to form the opening of the dielectric layer comprise using no more than one mask.

In one embodiment, the method further comprises the step of removing the patterned layer.

In one embodiment, the step of introducing the patterned layer comprises: depositing a metal layer, such that said conductive pillar electrically connects the electrically conductive portion of the substrate to the metal layer; and patterning the metal layer through a selective etching process to form the opening of the patterned layer.

In one embodiment, the steps from introducing the patterned layer to etching a portion of the dielectric layer to form the opening of the dielectric layer comprise using no more than one mask.

In one embodiment, the step of forming the patterned layer further comprises forming a resist layer on the metal layer.

In one embodiment, the method further comprises the step of removing the resist layer that is on the metal layer.

In one embodiment, the steps from introducing the patterned layer and to etching a portion of the dielectric layer to form the opening of the dielectric layer comprises using no more than two masks.

In one embodiment, the method further comprises the step of forming a solder layer over the conductive pillar.

In one embodiment, the step of forming a substrate having an electrically conductive portion thereon comprises sputtering a seed layer to form a redistribution layer, such that the redistribution layer forms the electrically conductive portion.

In one embodiment, the electrically conductive portion comprises a contact pad thereon.

In one embodiment, the step of forming the conductive pillar comprises electroplating the electrically conductive portion.

In one embodiment, the method further comprises coupling the conductive pillar to a package substrate.

In one embodiment, the step of forming the conductive pillar on the at least part of the electrically conductive portion comprises forming the pillar with a width that is 50 microns or less.

In one embodiment, the opening of the patterned layer is substantially aligned with the opening of the dielectric layer.

In one embodiment, the multilayer structure comprises an integrated circuit structure.

In one embodiment, the multilayer structure comprises an interposer.

BRIEF DESCRIPTION OF FIGURES

FIG. 1f shows a multilayer structure comprising a conductive pillar in accordance with some embodiments disclosed herein.

FIGS. 2a to 2h show an example embodiment of a process for forming a multilayer structure in the form of an integrated circuit structure comprising a conductive pillar and a metal layer. Particularly, FIG. 2h shows a multilayer structure comprising a conductive pillar in accordance with some embodiments disclosed herein.

FIG. 3h shows a multilayer structure comprising a conductive pillar in accordance with some embodiments disclosed herein.

FIGS. 4a to 4n show an example embodiment of a process for forming a multilayer structure in the form of an integrated circuit structure comprising one or more conductive pillars and two metal layers. Particularly, FIG. 4m shows an integrated circuit structure comprising one or more conductive pillars in accordance with some embodiments disclosed herein.

FIG. 5h shows an integrated circuit structure comprising one or more conductive pillars in a comparative example.

FIGS. 8a to 8k show a method for forming a conductive pillar on a substrate in a comparative example.

DETAILED DESCRIPTION

Figure 1A:
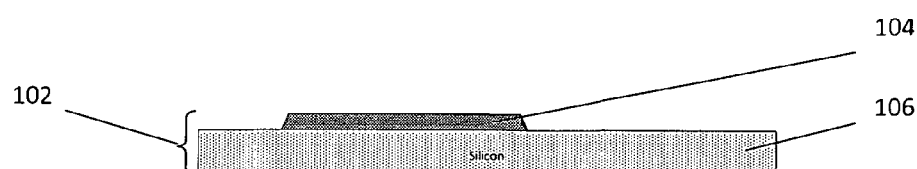
FIG. 1a to 1f show an example embodiment of a process for forming a multilayer structure in the form of an integrated circuit structure comprising a conductive pillar. Particularly.

Example embodiments described herein may provide a multilayer structure for a semiconductor device and a method for forming a multilayer structure for a semiconductor device. The multilayer structure may be, but is not limited to an Integrated Circuit (IC) structure. The IC structure may be, but is not limited to, a part of a wafer, wherein the method may be part of a wafer level packaging process. The multilayer structure may also be an interposer. The interposer may have thereon a topside metal layer interfacing dies, as well as a bottomside metal layer on which pillars may be formed. The interposer may be, but is not limited to a silicon-based interposer, suitable for 2.5D packaging technologies. The multilayer structure may contain, but is not limited to, a Bump-In-Via architecture, or a Bump on a Metal Layer architecture. An under bump metal (UBM) layer may be absent from the structure. Thus, the multilayer structure may include a bump with defined walls but yet without a UBM layer. The multilayer structure and method may be applied in flip-chip packaging technologies. In some example embodiments, The multilayer structure may be part of a semiconductor device. Therefore, in some example embodiments where the multilayer structure is an interposer, the interposer is part of a semiconductor device. The multilayer structure may also comprise organic, non-silicon material. Therefore, in some example embodiments where the multilayer structure is an interposer, the interposer is an organic, non-silicon based interposer.

Example embodiments of the present disclosure provide a multilayer structure for a semiconductor device, the multilayer structure comprising: a substrate having an electrically conductive portion thereon; a dielectric layer formed over the substrate, the dielectric layer comprising an opening over at least part of the electrically conductive portion; and a conductive pillar formed on the at least part of the electrically conductive portion; wherein the conductive pillar comprises walls defined by at least the opening of the dielectric layer and an opening of a patterned layer.

Example embodiments of the present disclosure also provide a method of forming a multilayer structure for a semiconductor device. The method comprises a step of providing a construct, which comprises: a substrate having an electrically conductive portion thereon; a dielectric layer formed over the substrate; an opening in said dielectric layer formed over at least part of the electrically conductive portion; and a patterned layer formed over the dielectric layer. The method further comprises a step of forming a conductive pillar on the at least part of the electrically conductive portion, such that the walls of the conductive pillar are defined by the opening of the dielectric layer and an opening of the patterned layer.

The term "electrically conductive" as used herein to describe a material is to be interpreted broadly to include, but not limited to, both a conductive material, which is intrinsically or inherently capable of electrical conductivity, and a semiconductive material, which exhibits semiconducting properties.

The term "substrate" as used herein is to be interpreted broadly to refer to a structure to which one or more materials, or one or more layers of material may be deposited thereon. The substrate may comprise one or more layers of material deposited thereon. The substrate may comprise a wafer comprising one or more layers of material such as, but not limited to, e.g. dielectric layers, metal layers, etc. deposited thereon.

The term "layer" when used to describe a structure is to be interpreted broadly to refer to a level or thickness of the structure that is distinguishable from another level or thickness of another structure. The structure is distinguishable from the other structure and may comprise same or different materials. The structure and the other structure may be same or different, as long as they are distinguishable from each other. A layer is not limited to a single material but may comprise one or more sub-layers or intermediate layers of one or more materials, which may themselves also be distinguishable from adjacent layers. Accordingly, when the layer is formed by individual sub-layers or intermediate layers, the dimensions of each of individual sub-layer or intermediate layer may be same or different.

The terms "coupled" or "connected" as used in this description are intended to cover both directly connected or connected through one or more intermediate means, unless otherwise stated.

The term "associated with", used herein when referring to two elements refers to a broad relationship between the two elements. The relationship includes, but is not limited to a physical, a chemical or an electrical relationship. For example, when element A is associated with element B, elements A and B may be directly or indirectly attached to each other or element A may contain element B or vice versa.

The term "adjacent" used herein when referring to two elements refers to one element being in close proximity to another element and may be but is not limited to the elements contacting each other or may further include the elements being separated by one or more further elements disposed therebetween.

The term "and/or", e.g., "X and/or Y" is understood to mean either "X and Y" or "X or Y" and should be taken to provide explicit support for both meanings or for either meaning.

Further, in the description herein, the word "substantially" whenever used is understood to include, but not restricted to, "entirely" or "completely" and the like. In addition, terms such as "comprising", "comprise", and the like whenever used, are intended to be non-restricting descriptive language in that they broadly include elements/components recited after such terms, in addition to other components not explicitly recited. Further, terms such as "about", "approximately" and the like whenever used, typically means a reasonable variation, for example a variation of +/−5% of the disclosed value, or a variance of 4% of the disclosed value, or a variance of 3% of the disclosed value, a variance of 2% of the disclosed value or a variance of 1% of the disclosed value.

Furthermore, in the description herein, certain values may be disclosed in a range. The values showing the end points of a range are intended to illustrate a preferred range. Whenever a range has been described, it is intended that the range covers and teaches all possible sub-ranges as well as individual numerical values within that range. That is, the end points of a range should not be interpreted as inflexible limitations. For example, a description of a range of 1% to 5% is intended to have specifically disclosed sub-ranges 1% to 2%, 1% to 3%, 1% to 4%, 2% to 3% etc., as well as individually, values within that range such as 1%, 2%, 3%, 4% and 5%. The intention of the above specific disclosure is applicable to any depth/breadth of a range.

Additionally, when describing some embodiments, the disclosure may have disclosed a method and/or process as a particular sequence of steps. However, unless otherwise required, it will be appreciated that the method or process should not be limited to the particular sequence of steps disclosed. Other sequences of steps may be possible. The particular order of the steps disclosed herein should not be construed as undue limitations. Unless otherwise required, a method and/or process disclosed herein should not be limited to the steps being carried out in the order written. The sequence of steps may be varied and still remain within the scope of the disclosure.

Example embodiments of the disclosure will be better understood and readily apparent to one of ordinary skill in the art from the following discussions and if applicable, in conjunction with the Figures. It should be appreciated that other modifications related to structural, electrical and optical changes may be made without deviating from the scope of the invention. Example embodiments are not necessarily mutually exclusive as some may be combined with one or more embodiments to form new exemplary embodiments.

FIGS. 1a to 1f show an example embodiment of a process for forming a multilayer structure in the form of an integrated circuit comprising a conductive pillar. This process may be referred to as a double resist imaging process (DRIP).

FIG. 1a shows a contact pad 104 formed on a die 106. It will be appreciated that the die 106 may be a portion of a wafer and is not diced from the wafer to form a singular disparate die. Alternatively, the die 106 may already be diced from the wafer and is separate from other dies. In a further alternative, the die 106 may be a part of a group of dies. The die 106 may comprise of semiconducting material on which integrated circuits comprising of e.g. transistors, diodes and metal layers and contacts are fabricated on a silicon base. The contact pad 104 may serve to electrically connect an integrated circuit formed on the die to a pin on an eventually packaged chip (not shown). The contact pad 104 may comprise of e.g. tungsten, titanium, a noble metal, gold, gold coating on another metal or metal alloy, silver, silver coating on another alloy, aluminium, copper, palladium or mixtures thereof. The die 106 may comprise of multiple layers of different materials which are not shown in detail.

In this particular example embodiment, the die 106 and the contact pad 104 formed thereon may be collectively referred to as a substrate 102, wherein the contact pad 104 may broadly be referred to as an electrically conductive portion of the substrate 102.

Figure 1B:
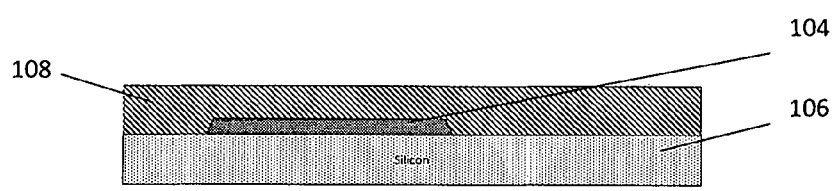
Figure 1C:
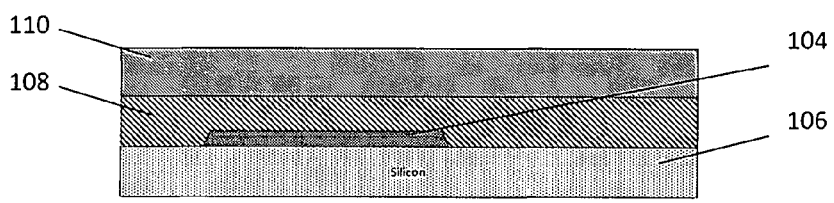

FIG. 1*b* shows a photoimagable dielectric layer 108 formed on or over the substrate 102. The dielectric layer 108 may be formed over the substrate 102 via e.g. spin coating, silk screen printing or deposition. Thereafter, a photo resist layer 110 is formed on or over the dielectric layer 108. The photo resist layer 110 may be formed via e.g. spin coating, as shown in FIG. 1*c*

Figure 1D:
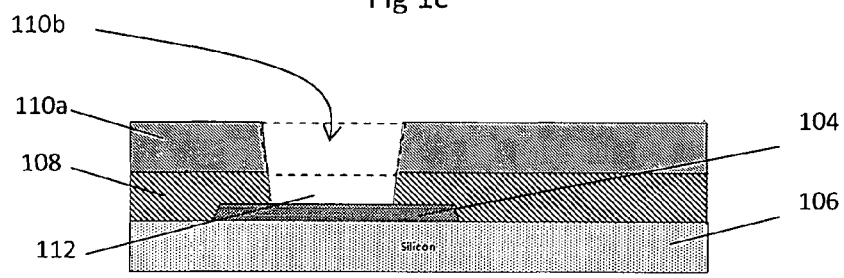

Thereafter, as illustrated in FIG. 1*d*, the photo resist layer 110 is patterned such that a portion 110*b* of the photo resist layer 110 is removed. In the example embodiments of the present application, the patterned photo resist layer 110*a* is obtained by a photolithography process. In such a photolithography process, the portion 110*b* of the resist layer 110 to be removed is exposed to UV light through a photo mask (not shown), and then developed. In other words, the photo resist layer 110 is patterned to form a patterned layer 110*a* over the dielectric layer 108. Accordingly, in some embodiments, the patterned layer described herein comprises a patterned photo resist layer.

While it has been described in this particular embodiment that numeral 110 is a photo resist layer, and a portion 110*b* of the photo resist layer is removed by photolithography process techniques, it will be appreciated that other types of layers may be used to eventually form the patterned layer through other etching processes such as chemical etching.

In this particular embodiment, the same photo mask used in the removal of the portion 110*b* of the resist layer 110 above, is used to remove a portion of the dielectric layer 108 to form an opening 112 in the dielectric layer 108, through similar photolithography processes or other etching processes as described above for the formation of the patterned layer 110*a*. This results in the opening 112 of the dielectric layer 108 being substantially aligned with the opening or aperture formed in the patterned photo resist layer 110*a*. The opening of the dielectric is formed over at least a portion of the contact pad 104, as shown in FIG. 1*d*.

In some example embodiments, it may be possible to implement a two step stripping process to strip the portion of the photo resist layer 110 to form the opening 110*b*, and subsequently to strip the portion of the dielectric layer 120 to form the dielectric opening 112. A different chemical may be used to remove the portion of the photo resist layer 110 to form the opening 110*b* from the chemical used to remove the portion of the dielectric layer 108 to form the dielectric opening 112.

It will be appreciated that the photolithography processes described herein will be understood to a person skilled in the art reading the present specification and the detailed steps of cleaning, preparation, UV exposure and developing will not be reproduced here for succinctness.

Figure 1E:
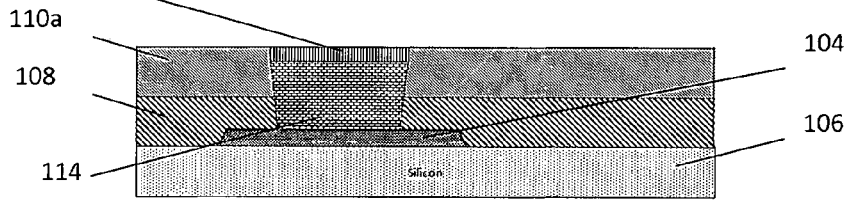

Next, as shown in FIG. 1*e*, a conductive pillar or bump is formed directly on the portion of the contact pad 104 exposed by the opening in the dielectric layer 108 and the opening formed in the patterned photo resist layer 110*a*. The walls of the conductive pillar or bump 114 are defined by the opening of the dielectric layer 108 and the opening of the patterned photo resist layer 110*a*. The top of the pillar 114 is also substantially flush with (and substantially does not protrude) the top surface of the patterned photo resist layer 110*a*. In the example embodiments, the electrically conductive pillar or bump is formed by the electroplating of electrically conductive material such as e.g. copper, gold, nickel, carbon nano-tubes, tin-lead alloys, tin-silver-copper alloys, or mixtures thereof, etc. The copper conductive pillar or bump 114 may further comprise a solder layer 116 formed at a tip of the pillar 114. The solder layer 116 may comprise of gold, copper, silver, copper plated gold, palladium, tin-lead alloys, tin-silver-copper alloys or mixtures thereof.

Figure 1F:
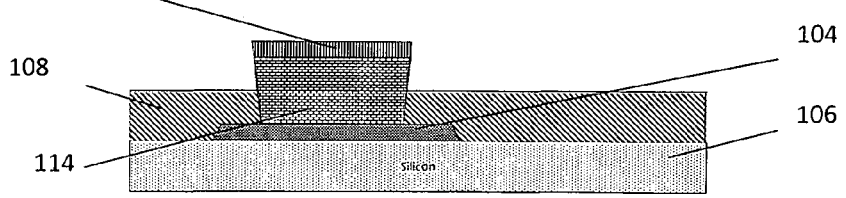

Thereafter, as shown in FIG. 1*f*, the patterned resist layer 110*a* is removed from the integrated circuit structure 100 such that the pillar 114 forms a bump which protrudes from or extends above the dielectric layer 108. The removal of the patterned resist layer 110*a* may be through resist stripping techniques, wherein the resist layer 110*a* is chemically altered by imaging and eventually strip off by chemical process.

FIGS. 2*a* to 2*h* show an example embodiment of a process for forming a multilayer structure in the form of an integrated circuit structure comprising a conductive pillar and a metal layer. This may be referred to as the formation of a 1 Metal Layer (1ML) Resist Defined Bump (RDB) architecture formed via a double resist imaging process (DRIP).

Figure 2A:
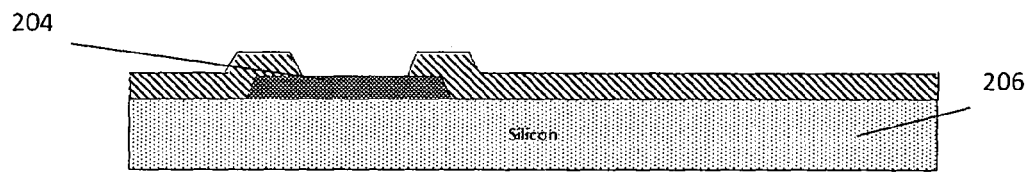

FIG. 2*a* shows a contact pad 204 formed on a die 206. It will be appreciated that the die 206 may be a portion of a wafer and is not diced from the wafer to form a singular disparate die. Alternatively, the die 106 may already be diced from the wafer and is separate from other dies. In a further alternative, the die 106 may be a part of a group of dies. The die 206 may comprise of semiconducting material on which integrated circuits comprising of e.g. transistors, diodes and metal layers and contacts are fabricated on a e.g. silicon base. The contact pad 204 may serve to electrically connect an integrated circuit formed on the die to a pin on an eventually packaged die (not shown). The contact pad 204 may comprise of e.g. tungsten, titanium, a noble metal, gold, gold coating on another metal or metal alloy, silver, silver coating on another alloy, aluminium, copper, palladium or mixtures thereof. The die 206 may comprise of multiple layers of different materials which are not shown in detail.

Figure 2B:
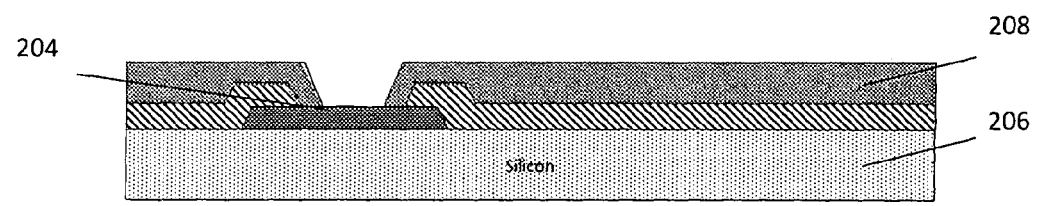

FIG. 2*b* shows a first dielectric layer 208 coated and patterned on or over the die 206. The first dielectric layer 208 comprises an opening to allow a portion of the contact pad 204 to be exposed. This may be achieved by first e.g. spin coating the dielectric layer 208 over the die, and subsequently by applying photolithography process techniques e.g. such as the further coating of a photo resist layer (not shown) and its subsequent exposure to UV through an e.g. photo mask to form the pattern such that the area where the opening is desired is exposed, etching of the dielectric layer where the opening is desired, and finally stripping of the photo resist layer. Alternatively, the opening may be formed simply by UV exposure through a photo mask. Etching methods such as e.g. chemical or laser etching may be employed to form the opening of the dielectric layer 208. Other suitable methods to form the opening of the dielectric layer 208 may also be used.

Figure 2C:
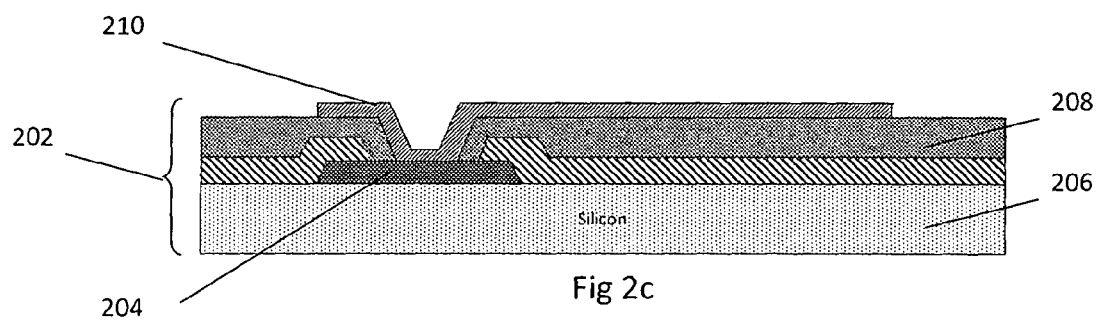

Thereafter, as shown in FIG. 2*c*, a metal layer 210 is formed over the first dielectric layer and the exposed portion of the pad. This metal layer 210 serves as a redistribution layer (RDL) which can allow the electrically conductive pillar to be formed at another location of the die, instead of directly above the contact pad. The metal layer 210, may be formed by first e.g. sputtering a seed layer of e.g. copper on the surface of the first dielectric layer and the exposed portion of the pad, and electroplating the sputtered seed layer to form the RDL. Other suitable methods of forming the RDL may also be used.

The electroplating of the sputtered seed layer can be patterned via photolithography processes (not shown), including the steps of
- coating of a photo resist layer,
- exposing the coated photo resist layer to UV (Ultra Violet) radiation through an e.g. photo mask to form the pattern such that the area where the RDL is desired is exposed,
- electroplating the exposed portion of the sputtered seed layer,
- stripping the photo resist layer, and
- etching away portions of the seed layer where plating is not desired.

In this particular example embodiment, the die 206, contact pad 204, first dielectric 208, and redistribution metal layer 210 formed thereon may be collectively referred to as a substrate 202, wherein the redistribution metal layer 210 may be referred broadly to as an electrically conductive portion of the substrate 202. As will be appreciated, the die 208 may contain intermediate layers but which are not directly involved in the formation of the bump or pillar of the present disclosure and thus are not further described herein for clarity.

Figure 2D:
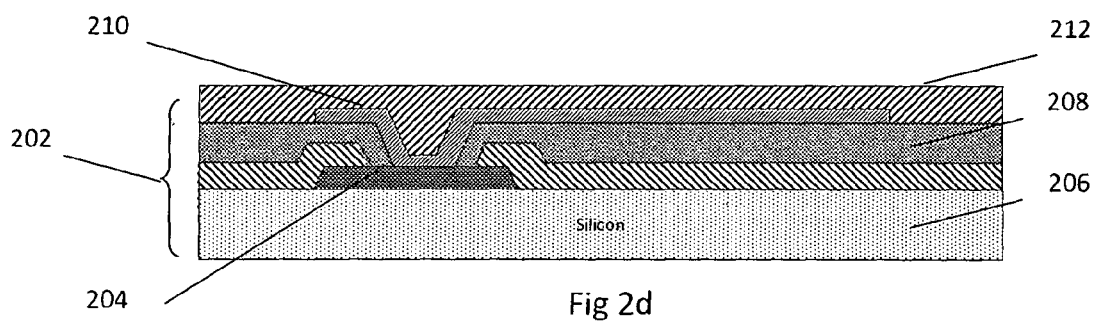

FIG. 2d shows a second dielectric layer 212 formed on or over the substrate 202. The dielectric layer 212 may be formed over the substrate 202 via e.g. spin coating, silk screen printing or deposition. Thereafter, a photo resist layer 214 is formed on or over the dielectric layer 212. The photo resist layer 214 may be formed via e.g. spin coating, as shown in FIG. 2e.

Thereafter, as illustrated in FIG. 2f, the photo resist layer 214 is patterned such that a portion 214b of the photo resist layer 214 is removed. In this particular embodiment, the patterned photo resist layer 214a is obtained by a photolithography process. In such a photolithography process, the portion 214b of the resist layer 110 to be removed is exposed to UV light through a photo mask (not shown), and then developed. In other words, the photo resist layer 214 is patterned to form a patterned layer 214a over the dielectric layer 212. Accordingly, in some embodiments, the patterned layer described herein comprises a patterned photo resist layer.

While it has been described in this particular embodiment that numeral 214 is a photo resist layer, and a portion 214b of the photo resist layer is removed by photolithography process techniques, it will be appreciated that other types of layers may be used to eventually form the patterned layer through other etching processes such as chemical etching.

In this particular embodiment, the same photo mask used in the removal of the portion 214b of the photo resist layer 214 above, is used to remove the portion of the dielectric layer 212 to form an opening 216 in the dielectric layer 212, through similar photolithography processes or other etching processes as described above for the formation of the patterned layer 214a. This results in the opening 216 of the dielectric layer 212 being substantially aligned with the opening or aperture formed in the patterned photo resist layer 214a.

The opening 216 is formed over at least a portion of the RDL 210, as shown in FIG. 2f.

It will be appreciated that the photolithography processes described herein will be understood to a person skilled in the art reading the present specification and the detailed steps of cleaning, preparation, UV exposure and developing will not be reproduced here for succinctness.

Next, as shown in FIG. 2g, a conductive pillar or bump is formed directly on the portion of the RDL 210 exposed by the opening 216 in the dielectric layer 212 and the opening formed in the patterned photo resist layer 214a. The walls of the conductive pillar or bump 218 are defined by the opening 216 of the dielectric layer 212 and the opening of the patterned photo resist layer 214a. The top of the pillar 218 is also substantially flush with (and substantially does not protrude) the top surface of the patterned photo resist layer 214a. In the example embodiments, the electrically conductive pillar or bump is formed by the electrolytic plating of electrically conductive material such as e.g. copper, gold, nickel, palladium, carbon nano-tubes, tin-lead alloys, tin-silver-copper alloys, or mixtures thereof, etc. The copper conductive pillar or bump 218 may further comprise a solder layer 220 formed at a tip of the pillar 218. The solder layer 220 may comprise of gold, copper, silver, copper plated gold, palladium, tin-lead alloys, tin-silver-copper alloys or mixtures thereof.

Thereafter, as shown in FIG. 2h, the patterned resist layer 214a is removed from the integrated circuit structure such that the pillar 218 forms a bump which protrudes from the dielectric layer 212. The removal of the patterned resist layer 214a may be through resist stripping techniques, wherein the resist layer 214a is chemically altered by imaging and eventually stripped off by chemical process.

FIGS. 3a to 3h show an example embodiment of a process for forming a multilayer structure in the form of an integrated circuit structure comprising a conductive pillar and two metal layers. This may be referred to as the formation of a 2 Metal Layer (2ML) Resist Defined Bump (RDB) architecture formed via a double resist imaging process (DRIP).

Figure 3A:
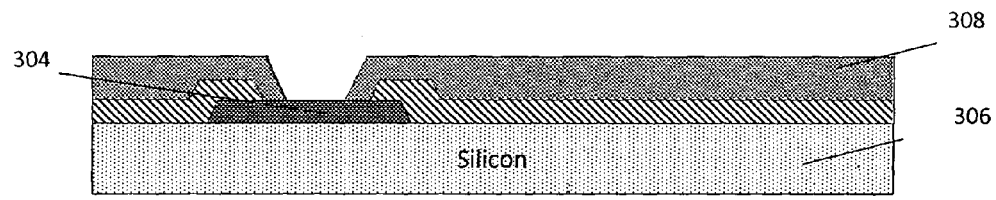
FIGS. 3a to 3h show an example embodiment of a process for forming a multilayer structure in the form of an integrated circuit structure comprising a conductive pillar and two metal layers. Particularly.

FIG. 3a shows a contact pad 304 formed on a die 306. It will be appreciated that the die 306 may be a portion of a wafer and is not diced from the wafer to form a singular disparate die. Alternatively, the die may already be diced from the wafer and is separate from other dies. In a further alternative, the die 306 may part of a group of dies. The die 306 may comprise of semiconducting material on which integrated circuits comprising of e.g. transistors, diodes and metal layers and contacts are fabricated on a silicon base. The contact pad 304 serves to electrically connect an integrated circuit formed on the die to a pin on an eventually packaged chip (not shown). The contact pad may comprise of e.g. tungsten, titanium, a noble metal, gold, gold coating on another metal or metal alloy, silver, silver coating on another alloy, aluminium, copper, palladium or mixtures thereof. The die 306 may comprise of multiple layers of different materials which are not shown in detail.

A first dielectric layer 308 is coated and patterned on or over the die 306. The first dielectric layer 308 comprises an opening to allow a portion of the contact pad 304 to be exposed. This may be achieved by first e.g. such as the further coating of a photo resist layer (not shown) and its subsequent exposure to UV through an e.g. photo mask to form the pattern such that the area where the opening is desired is exposed, etching of the dielectric layer where the opening is desired, and finally stripping of the photo resist layer. Alternatively, the opening may be formed simply by UV exposure through a photo mask. Etching methods such as e.g. chemical or laser etching may be employed to form the opening of the dielectric layer 308. Other suitable methods to form the opening of the dielectric layer 308 may also be used.

Figure 3B:
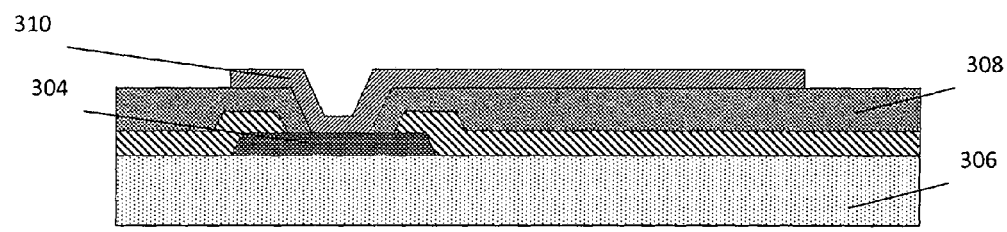

Thereafter, as shown in FIG. 3b, a metal layer 310 is formed over the first dielectric layer and the exposed portion of the pad. This metal layer 310 can serve as a first redistribution layer (RDL) which can allow the electrically conductive pillar to be formed at another location of the die, instead of directly above the contact pad. This metal layer 310, may be formed by first e.g. sputtering a seed layer of e.g. copper on the surface of the first dielectric layer and the exposed portion of the pad, and electrolytic-plating the sputtered seed layer to form the RDL. Other suitable methods of forming the RDL may also be used.

The electroplating of the sputtered seed layer can be patterned via photolithography processes (not shown), including the steps of
coating of a photo resist layer,
exposing the coated photo resist layer to UV (Ultra Violet) radiation through an e.g. photo mask to form the pattern such that the area where the RDL is desired is exposed,
electroplating the exposed portion of the sputtered seed layer,
stripping the photo resist layer, and
etching away portions of the seed layer where plating is not desired.

Figure 3C:
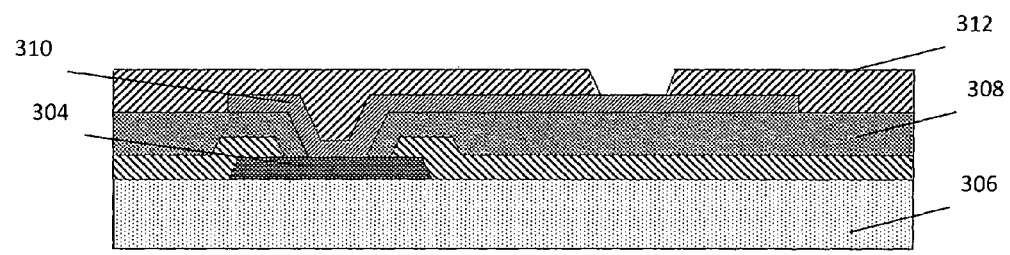
Figure 3D:
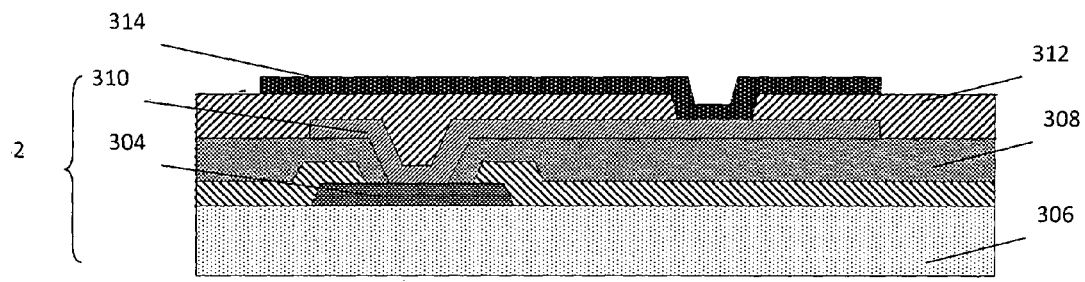

The process described in FIGS. 3a and 3b is repeated such that a second RDL is formed. Briefly, a second dielectric layer 312 is coated on the first RDL 310, wherein the second dielectric layer having an opening to allow a portion of the first RDL 310 to be exposed as shown in FIG. 3c. Thereafter, as shown in FIG. 3d, a second RDL 314 is formed over the second dielectric layer 312 and the exposed portion first RDL 310. This second RDL allows can allow the bump to be formed at a further different location of the die.

In this particular example embodiment, the die 306, contact pad 304, first dielectric layer 308, first redistribution metal layer 310, second dielectric layer 312, and second redistribution metal layer 314 formed thereon may be collectively referred to as a substrate 302, wherein the second redistribution metal layer 314 may be broadly referred to as an electrically conductive portion of the substrate 302. As will be appreciated, the die 306 may contain intermediate layers but which are not directly involved in the formation of the bump or pillar of the present disclosure and thus are not further described herein for clarity.

Figures 3E, 3F, 3G, 3H:
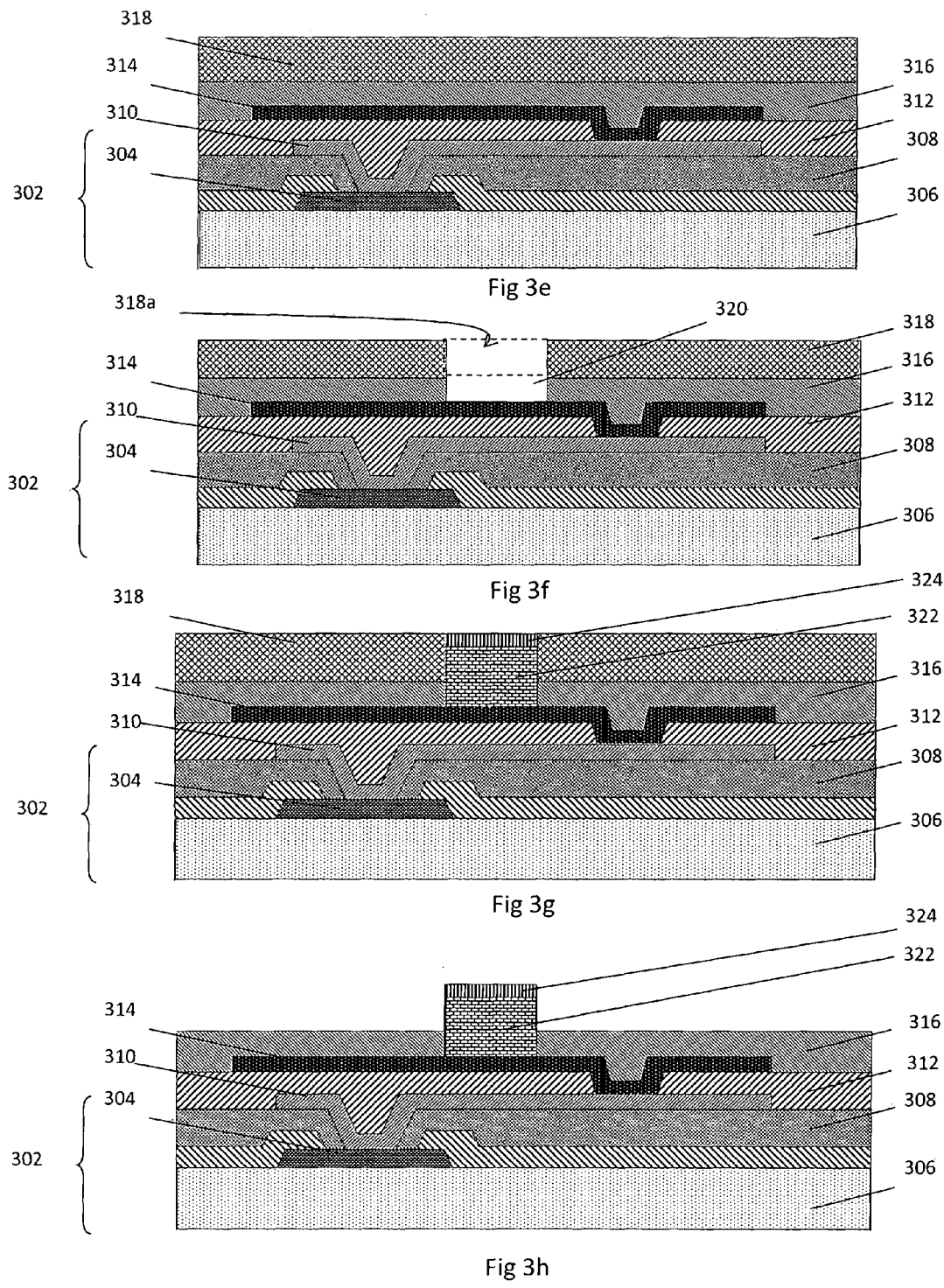

FIG. 3e shows the third dielectric layer 316 formed on or over the substrate 302. The dielectric layer 316 may be formed over the substrate 302 via e.g. spin coating, silk screen printing or deposition. Thereafter, a photo resist layer 318 is formed on or over the dielectric layer 316. The photo resist layer 318 may be formed via e.g. spin coating or silk screen printing Thereafter, as illustrated in FIG. 3f, the photo resist layer 318 is patterned such that a portion 318b of the photo resist layer 318 is removed. In this particular embodiment, the patterned photo resist layer 318a is obtained by a photolithography process. In such a photolithography process, the portion 318b of the resist layer 318 to be removed is exposed to UV light through a photo mask (not shown), and then developed. In other words, photo resist layer 318 is patterned to form a patterned layer 318a over the dielectric layer 316. Accordingly, in some embodiments, the patterned layer described herein comprises a patterned photo resist layer.

While it has been described in this particular embodiment that numeral 318 is a photo resist layer, and a portion 318b of the resist layer 318 is removed photolithography process techniques, it will be appreciated that other types of layers may be used to eventually form the patterned layer through other etching processes such as chemical etching.

In this particular embodiment, the same photo mask as used in the removal of the portion 318b of the resist layer 318 above, is used to remove a portion of the dielectric layer 316 to form an opening 320 in the dielectric layer 316, through similar photolithography processes or other etching processes as described above for the formation of the patterned layer 318a. This results in the opening 320 of the dielectric layer 316 being substantially aligned with the opening or aperture formed in the patterned photo resist layer 318a.

The opening 320 is formed over at least a portion of the second RDL 314, as shown in FIG. 3f.

It will be appreciated that a photolithography process described herein will be understood to a person skilled in the art reading the present specification and the detailed steps of cleaning, preparation, UV exposure and developing will not be reproduced here for succinctness.

Next, as shown in FIG. 3g, a conductive pillar or bump is formed directly on the portion of the second RDL 314 exposed by the opening 320 in the dielectric layer 316 and the opening formed in the patterned photo resist layer 318a. The walls of the conductive pillar or bump 322 are defined by the opening 320 of the dielectric layer 316 and the opening patterned photo resist layer 318a. The top of the pillar 322 is also substantially flush with (and substantially does not protrude) the top surface of the patterned photo resist layer 318a. In the example embodiments, the electrically conductive pillar or bump 322 is formed by the electroplating of electrically conductive material such as e.g. copper, gold, nickel, carbon nano-tubes, tin-lead alloys, tin-silver-copper alloys, or mixtures thereof, etc. The copper conductive pillar or bump 322 may further comprise a solder layer 324 formed at a tip of the pillar 322. The solder layer 324 may comprise of gold, copper, silver, copper plated gold, palladium, tin-lead alloys, tin-silver-copper alloys or mixtures thereof.

Thereafter, as shown in FIG. 3h, the patterned resist layer 318a is removed from the integrated circuit structure such that the pillar 322 forms a bump which protrudes from the dielectric layer 316. The removal of the patterned resist layer 318a may be through resist stripping techniques, wherein the resist layer 318a is chemically altered by imaging and eventually stripped off by chemical process.

While the description above for the example embodiments of the present application illustrated by FIGS. 1, 2 and 3 state that the steps of forming the patterned layer and opening in the dielectric layer to be separate steps, it will be appreciated that they can be performed as a single step. That is, a single lithography step may be performed with a single mask such that the formation of the patterning layer also creates the opening in the dielectric layer at the same time.

In addition, while the example embodiments illustrated by FIGS. 1, 2 and 3 show one contact pad respectively, it will be appreciated that there can be more than one contact pad.

Figure 4N:
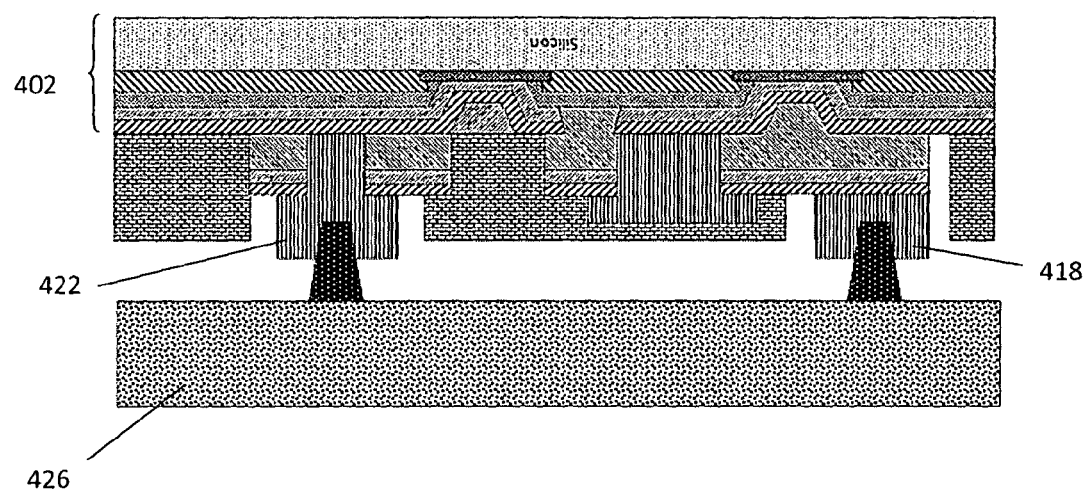

FIGS. 4a to 4n show an example embodiment of a process for forming a multilayer structure in the form of an integrated circuit structure comprising one or more electrically conductive pillars and two metal layers.

FIG. 4a shows contact pads 404a and 404b formed on a die 406. It will be appreciated that the die 406 may be a portion of a wafer (not shown) and is not diced from the wafer to form a singular disparate die. Alternatively, the die 406 may already be diced from the wafer and is separate from other dies. In a further alternative, the die 406 may be a part of a group of dies. The die 406 may comprise of semiconducting material on which integrated circuits comprising of e.g. transistors, diodes and metal layers and contacts are fabricated on a e.g. silicon base. The contact pads 404a and 404b may comprise of e.g. tungsten, titanium, a noble metal, gold, gold coating on another metal or metal alloy, silver, silver coating on another alloy, aluminium, copper, palladium or mixtures thereof. The die 406 may comprise of multiple layers of different materials which are not shown in detail.

FIG. 4b shows a first dielectric layer 408 coated and patterned on or over the die 406. The first dielectric layer 408 comprises openings to allow portions of the respective contact pads 404a and 404b to be exposed for electrical access by e.g. subsequent metal layers. This may be achieved by first e.g. spin coating the dielectric layer 408 over the die, and subsequently by applying photolithography process techniques as described earlier for FIG. 3a, including the further coating of a photo resist layer (not shown) and its subsequent exposure to UV through an e.g. photo mask to form the pattern such that the areas where the openings are desired are exposed, etching of the dielectric layer where the opening is desired, and finally stripping of the photo resist layer. Alternatively, the opening may be formed by UV exposure through a photo mask. Etching methods such as e.g. chemical or laser etching may be employed to form the opening of the dielectric layer 408. Other suitable methods to form the opening of the dielectric layer 408 may also be used.

Thereafter, as shown in FIGS. 4c to 4f, a metal layer 410 is formed over the first dielectric layer and the exposed portions of the pads. This metal layer 410 can serve as a first redistribution layer (RDL) which can allow a conductive pillar or via to be formed at another location of the die, instead of directly above the contact pad. Other suitable methods of forming the RDL may also be used.

As seen in FIG. 4c, the metal layer 410 comprises a seed layer 409 that may be formed by first e.g. sputtering e.g. copper on the surface of the first dielectric layer 408 and the exposed portions of the pads 404a, 404b, and subsequently electroplating the sputtered seed layer to form the metal layer or RDL.

As shown in FIGS. 4d to 4f, the electrolytic-plating of the sputtered seed layer may also be patterned via photolithography processes, including the steps of coating of a photo resist layer (not shown) and its subsequent exposure to UV (Ultra Violet) radiation through an e.g. photo mask to form the pattern such that the area where the RDL 410 is desired is exposed, and portions where the RDL 410 is not desired is blocked by residue photo resist layer 411. Subsequently, the exposed portion of the sputtered seed layer is electroplated to form the first RDL, and the residue photo resist layer 411 is stripped and portions of the seed layer where plating is not desired (e.g. under the residue photo resist layer 411) is etched away.

A second RDL is then formed, as shown in FIGS. 4g to 4j. As shown in FIG. 4g, a second dielectric layer 412 is coated on the first RDL 410. A second metal layer/RDL 414 is formed by e.g. sputtering or depositing a second seed layer and electrolytically plating the second seed layer, as seen in FIG. 4h. Thereafter, as shown in FIG. 4i, a patterned second RDL 414a is formed. The patterned second RDL may be formed by e.g. forming a photo resist (not shown) over the second RDL 414, using a photo mask to remove certain portions of the photo resist such that portions of the second RDL 414 are exposed, and etching away the exposed second RDL portions, leaving behind the patterned second RDL 414a.

It will be appreciated that second RDL 414a can be formed as a result of buss-line design added from the dicing saw street. There is no requirement to specifically sputter a second seed layer prior to the electrolytic plating as described above. For example, it will be appreciated by a skilled person reading the disclosure that a mechanical clamp/contact can be connected from the dicing saw to the buss-line which can allow for copper deposition to form the second RDL 414a.

The formation of the second patterned RDL 414a is different from the first patterned RDL 410. In the first RDL 410, the photo resist is applied prior to electroplating process. In contrast, in the second RDL, the photo resist is applied after the electroplating process. This allows the same photo mask that was used to form the patterned second RDL/metal layer 414a, to be re-used to remove the portions of the second dielectric layer 412 exposed by the patterned second RDL/metal layer 414a, as shown in FIG. 4j. The said portions of the second dielectric layer may be removed by e.g. a laser firing process, again using the same photo mask as used in the formation of the patterned second RDL/metal layer 414a. In some embodiments, the second patterned RDL 414a may serve as a "mask" to remove the portions of the second dielectric layer.

FIG. 4k shows a resist pattern layer or structure formed over the RDL/metal layers 410 and 414a. Similar to the steps described earlier in e.g. FIGS. 3e and 3f for the formation of the patterned photo resist layer 318, a photo resist layer is first e.g. spin-coated on the device. Thereafter, portions 416a (outlined with dotted lines) of the original resist layer is removed such that the patterned resist layer 416 is formed which exposes specific portions of the RDL/metal layers 410 and 414a. In this particular embodiment, the patterned photo resist layer 416 is obtained by a photolithography process. In such a photolithography process, the portion 416a of the resist layer to be removed is exposed to UV light through a photo mask (not shown), and then developed.

With the patterned resist layer 416 in place, electroplating of exposed portions of the RDL/metal layers 410 and 414a can take place to form various structures, as shown in FIG. 4l. The electroplating of an exposed second RDL/metal layer 414a only can allow the formation of a pillar which is a bump 418 that protrudes the second metal/RDL layer 414a. The electroplating of an exposed first RDL/metal layer 410, can allow the formation of a pillar which functions as a via 420 between the first and second RDL/metal layers 410, 414a. The via structure may also be incorporated with the bump structure to form a bump-in-via structure 422, such that not only does the electroplating electrically connect the first and second RDL/metal layers, it also protrudes the second RDL/metal layer to form a bump. It will be appreciated by a person skilled in the art that the width of each of the removed portions 416a of the patterned resist layer 416 defines the height of the electroplating, and hence the type of structure (i.e. via, bump, or bump-in-via) formed. The buss-line is eventually removed during dicing to isolate the individual dies.

It will further be appreciated that FIG. 4l shows the example embodiment after the removal of the patterned resist layer 416 through e.g. resist stripping techniques.

The copper conductive pillars may further comprise a solder layer formed at a tip of the pillar.

For completeness, a further protection resist layer 424 may also be patterned such that they are formed over the vias and/or RDL/metal layers for protection, as shown in FIG. 4m.

It will be appreciated that a photolithography process described herein will be understood to a person skilled in the art reading the present specification and the detailed steps of cleaning, preparation, UV exposure and developing will not be reproduced here for succinctness.

FIG. 4n shows the chip disclosed in FIG. 4m and bonded to a package substrate in the form of a Printed Circuit Board (PCB) 426 through the bump 418 and bump-in-via 422.

It will be appreciated that the package substrate is not the same as the substrate which the die 406 forms part of. The package substrate refers to an external substrate to which the integrated circuit structure is coupled to, through the bump. In this particular example embodiment, if reference to made to pillars 420 and 422, the die 406, contact pads 404a, 404b, first dielectric layer 408, and first redistribution metal layer 410 may collectively referred to as a substrate 402, wherein the first redistribution metal layer 410 may be broadly referred to as an electrically conductive portion of the substrate 402. The broad reference to a patterned layer may include, at least the second patterned RDL/metal layer 414a, and may further comprise the patterned resist structures/layer 416.

If reference is made to pillar 418, the die 406, contact pads 404a, 404b, first dielectric layer 408, first redistribution metal layer 410, second dielectric layer 412 and second redistribution layer 414 may collectively referred to as a substrate 402, wherein the second redistribution metal layer 414 may be broadly referred to as an electrically conductive portion of the substrate 402. The broad reference to a patterned layer may include, the patterned resist structures/layer 416.

Accordingly, in some embodiments, the walls of the conductive pillars are defined by an opening of the dielectric layer and an opening of the patterned layer, wherein the patterned layer is formed over the dielectric layer. In some embodiments, the patterned layer may comprise a resist layer. In other embodiments, the patterned layer may comprise a metal layer. In further embodiments, the patterned layer may comprise a metal layer and a resist layer. As such, it will be appreciated that the patterned layer may comprise multiple sublayers or composite layers.

Comparative Examples

Figure 5A:
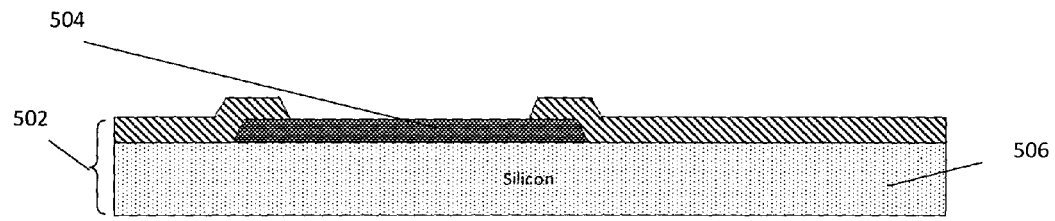
FIGS. 5a to 5h show a method for forming a conductive pillar on a substrate in a comparative example. Particularly.
Figure 5B:
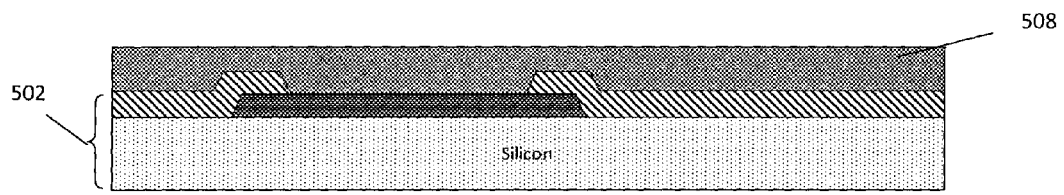

FIGS. 5a to 5g show a method for forming a conductive pillar on a substrate in a comparative example. FIG. 5a shows a contact pad 504 formed on a die 506 which collectively form the substrate 502. FIG. 5b shows a dielectric layer 508 formed on or over the substrate 502. The dielectric layer 508 may be formed over the substrate 502 via e.g. spin coating.

Figure 5C:
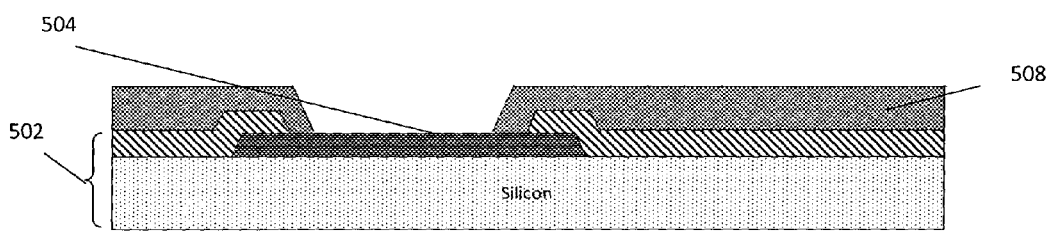

Subsequently, as shown in FIG. 5c, an opening in the dielectric layer 508 is formed such that a portion of the contact pad 504 is exposed. It will be appreciated that the opening may be formed by lithographic methods such as the UV exposure of the dielectric layer 508 via a photo mask.

Figure 5D:
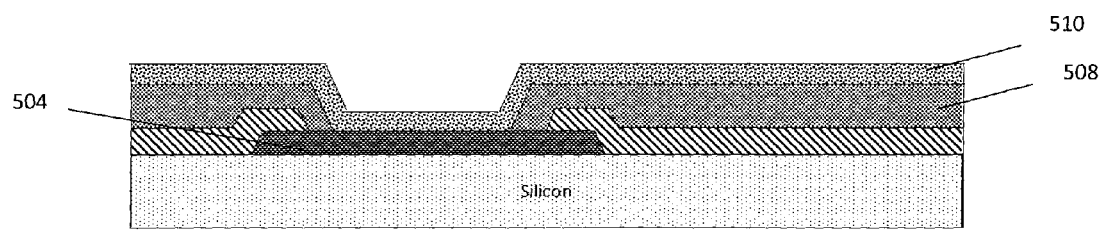
Figure 5E:
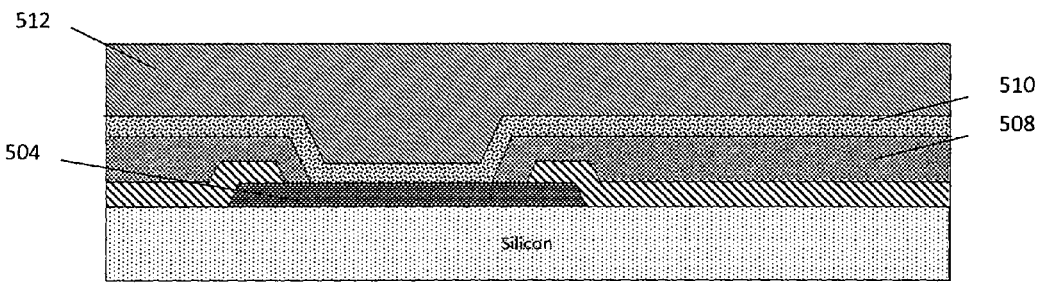
Figure 5F:
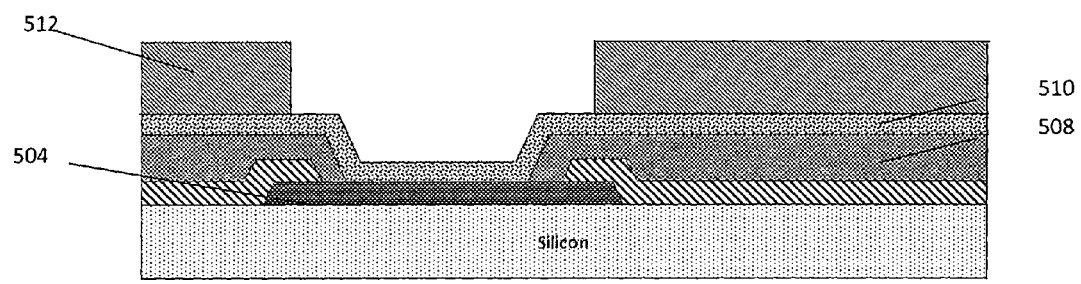

Thereafter, as illustrated in FIGS. 5d and 5e, a seed layer 510 of metal is sputtered onto the die, and a layer of photo resist 512 is coated over the seed layer 510. The photo resist layer 512 is patterned such that a portion of the photo resist layer 510 (where the bump is to be formed i.e. over the pad 504) is removed, as shown in FIG. 5f.

Figure 5G:
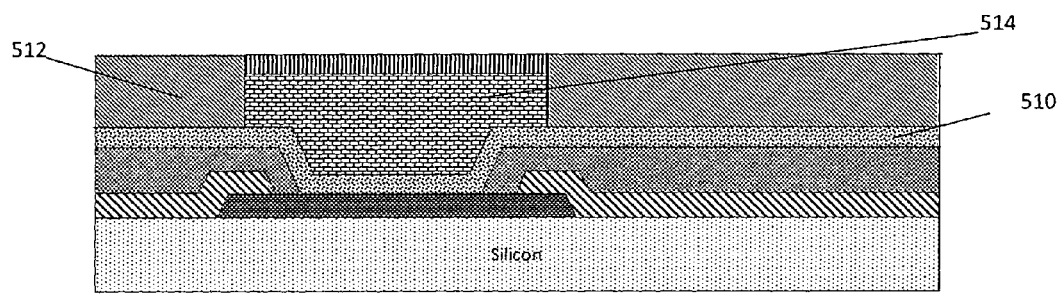

Next, as shown in FIG. 5g, a conductive pillar 514 is formed in the removed portion of the photo resist layer 512 by electrolytic plating of the sputtered seed metal layer 510. In other words, the conductive pillar is formed on the sputtered seed metal layer, which may also be referred to as the under bump metal, or the under pillar metal.

Figure 5H:
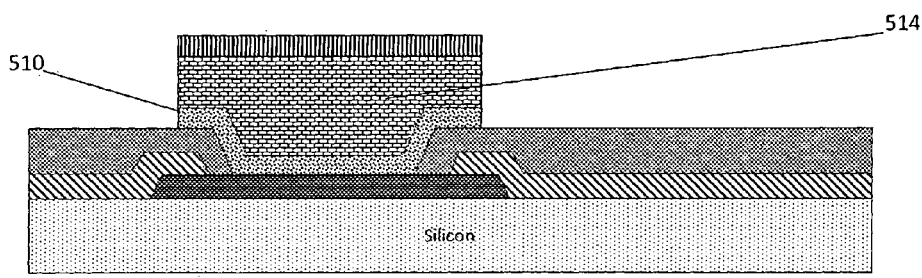

Finally, as shown in, FIG. 5h, the patterned photo resist layer 512 and portions of the seed metal layer 510 (not used by the conductive pillar 514) are removed by e.g. resist strip and etching processes respectively.

In the comparative example illustrated in FIG. 5h, the walls of the conductive pillar 512 are defined by the patterned photo resist layer 510, and sit directly on the seed metal layer 510 (or under bump/pillar metal). It is appreciated that the walls of the conductive pillar 512 are not defined by a dielectric layer or an opening of a dielectric layer. Thus, it can be seen that the walls of the conductive pillar 512 do not abut a dielectric layer.

In contrast, the example embodiment illustrated in e.g. FIGS. 1e and 1f of the present application shows a conductive pillar 114, where the walls are defined by an opening dielectric layer 108 and a patterned photo resist layer 110a. It can be seen that the walls of the conductive pillar 114 abut the dielectric layer 108. In addition, the conductive pillar 114 can be formed directly on the pad 104, and does not require the additional seed metal layer 510 (FIG. 5).

Figure 6:
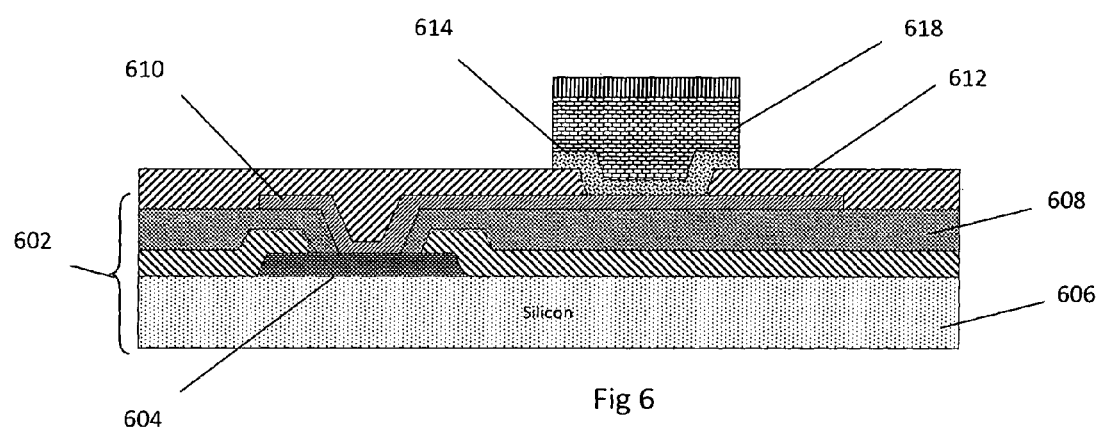
FIG. 6 shows a conductive pillar formed on an under bump metal in a comparative example.

FIG. 6 shows a pillar 618 formed on a substrate 602 in a comparative example. The substrate here includes a silicon die 606, a pad 604, a first dielectric layer 608 and a RDL/metal layer formed thereon 610. The RDL (metal layer) 610 is formed on the pad 604 and is coated over with a dielectric layer 612 with an opening. At the opening, an under pillar/bump metal seed layer 614 is sputtered on, and the pillar 618 is formed by electrolytic plating of the metal seed layer 614. It will be appreciated that the formation of the pillar 618 involves similar steps to those as described in FIGS. 5d to 5h above, with the difference that the sputter seed layer (and eventually the pillar) is formed above a section of the RDL instead of on the pad itself.

In contrast with the structure shown in FIG. 6, the example embodiment illustrated in e.g. FIGS. 2g and 2h of the present application shows a conductive pillar 218, where the walls are defined by an opening dielectric layer 212 and an opening in the patterned photo resist layer 214a. It can be seen that the walls of the conductive pillar 218 abut the dielectric layer 212 and the patterned photo resist layer 214a. In addition, the conductive pillar 218 is formed directly on the RDL 210, and does not require the additional seed metal layer 614 shown in FIG. 6.

FIGS. 7a to 7i show a method for forming a conductive pillar on a substrate in a comparative example.

Figure 7A:
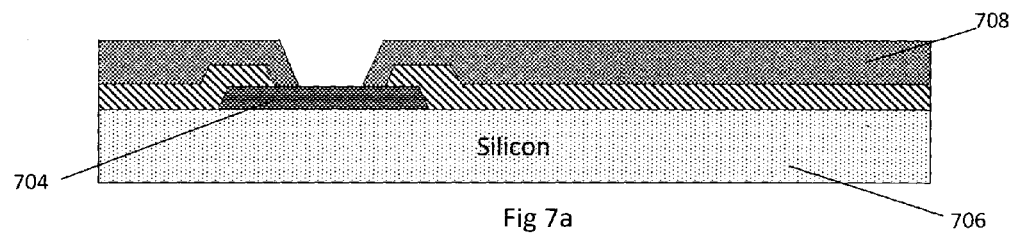
FIGS. 7a to 7i show a method for forming a conductive pillar on a substrate in a comparative example.
Figure 7B:
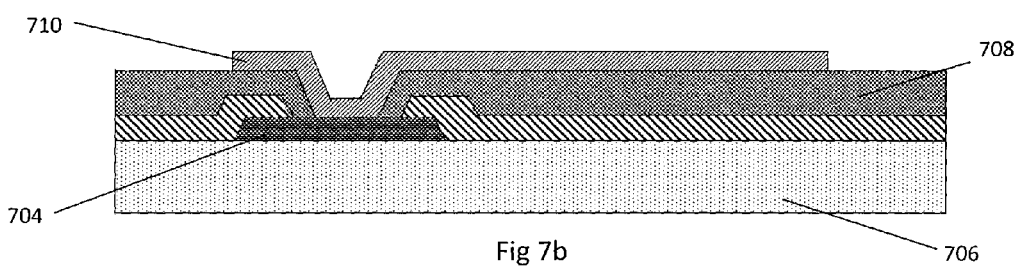
Figure 7C:
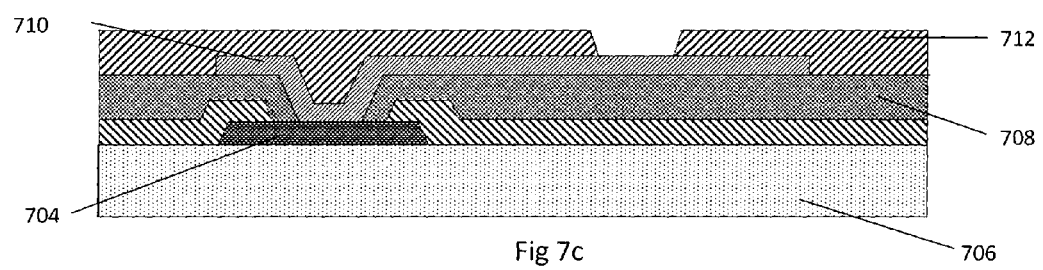
Figure 7D:
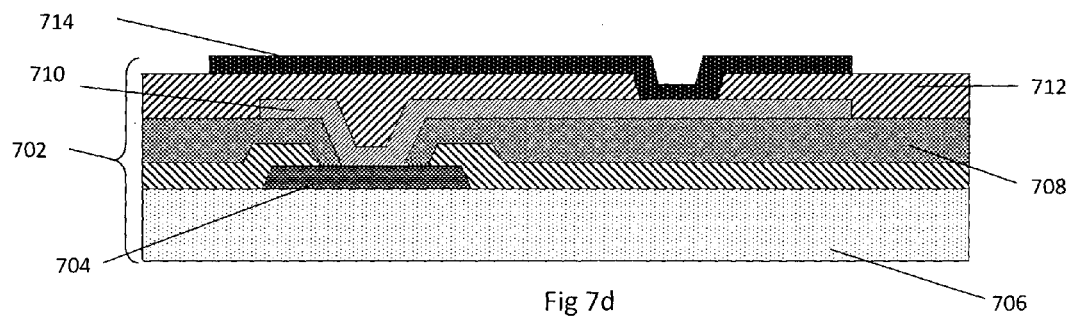

FIG. 7a shows a contact pad 704 formed on a die 706. A first dielectric layer 708 is coated and patterned on or over the die 706. The first dielectric layer 708 comprises an opening to allow a portion of the contact pad 704 to be exposed. Thereafter, as shown in FIG. 7b, a metal layer 710 is formed over the first dielectric layer and the exposed portion of the pad to serve as a first redistribution layer (RDL) 710 which can allow the bump or conductive pillar to be formed at another location of the die, instead of directly above the contact pad. The process described in FIGS. 7a and 7b is repeated such that a second RDL is formed. Briefly, a second dielectric layer 712 is coated on the first RDL 710, the second dielectric layer having an opening to allow a portion of the first RDL 710 to be exposed as shown in FIG. 7c. Thereafter, as shown in FIG. 7d, a second RDL layer 714 is formed over the second dielectric layer 712 and the exposed portion first RDL 710. This second RDL allows can allow the bump to be formed at a further different location of the die.

FIGS. 7e to 7i are similar to those as described in FIGS. 5b to 5h above, with the difference that the sputter seed layer (and eventually the pillar) is formed above a section of the second RDL 714 instead of on the pad. That is, a final dielectric layer 716 is formed over the substrate 702 via e.g. spin coating. The substrate 702 comprises of e.g. the earlier layers of the die 706, contact pad 704, first dielectric layer 708, first metal (RDL) layer 710, second dielectric layer 712 and a second metal (RDL) layer 714.

Figure 7E:
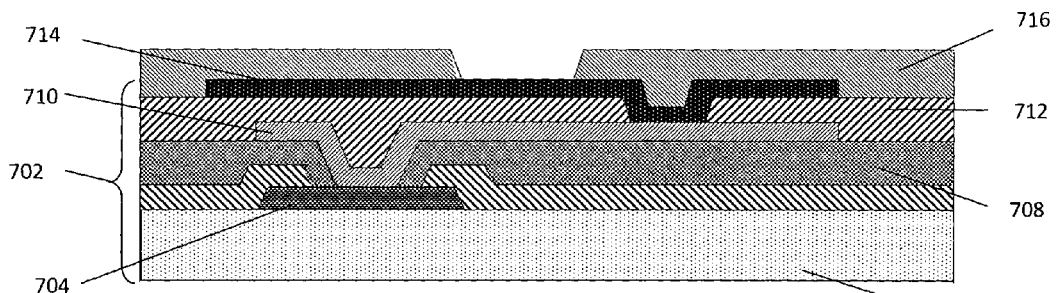

Subsequently, as shown in FIG. 7e, an opening in the final dielectric layer 716 is formed (via e.g. lithographic methods) such that a portion of the second metal (RDL) layer 714 is exposed.

Figure 7F:
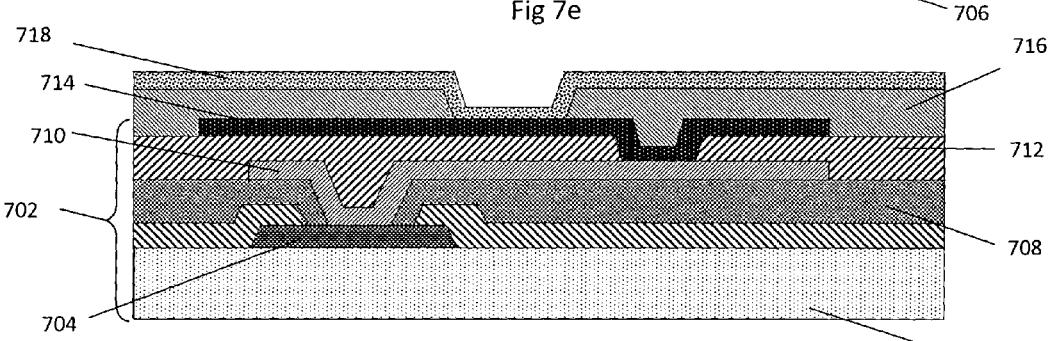
Figure 7G:
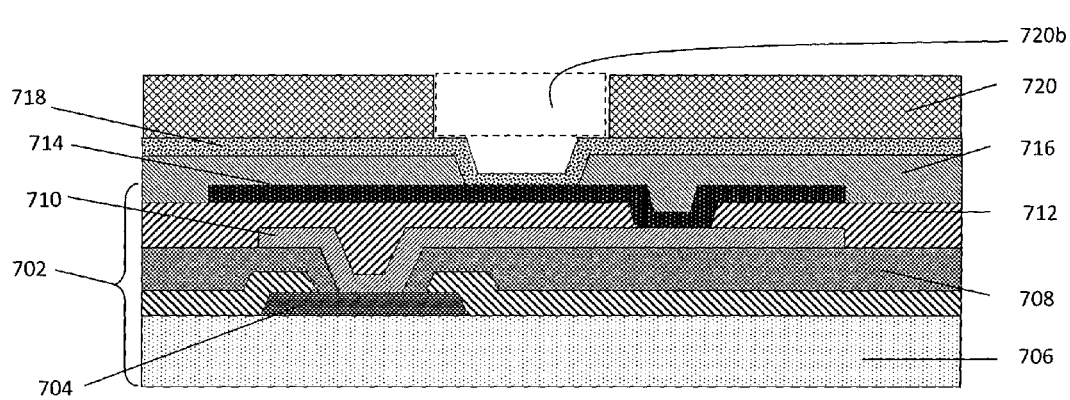

Thereafter, as shown in FIGS. 7f and 7g, a final seed layer of metal 718 is sputtered onto the die (i.e. to form the UBM layer), and a final layer of photo resist 720 is coated over the seed layer 718. The photo resist layer 720 is patterned such that a portion 720b of the photo resist layer 720 (where the bump is to be formed) is removed.

Figure 7H:
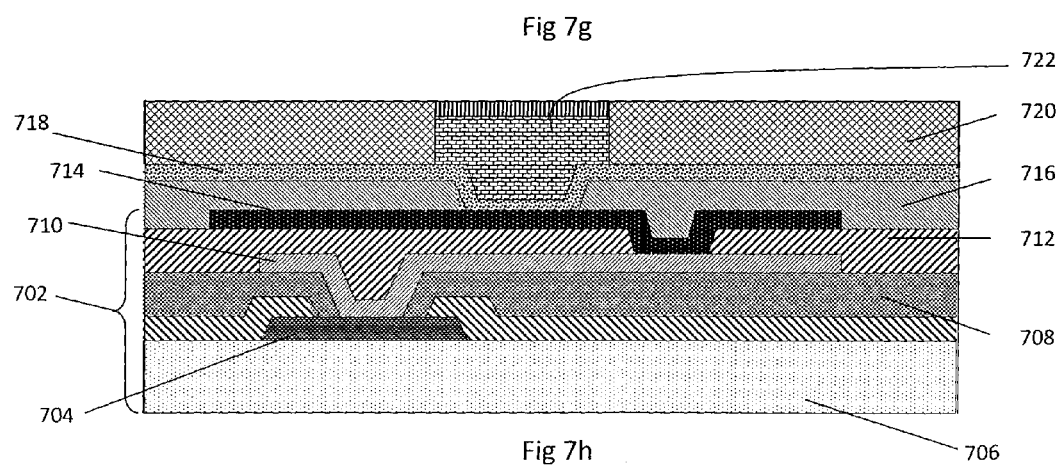

Next, as shown in FIG. 7h, a conductive pillar 722 is formed in the removed portion of the photo resist layer 720 by electrolytic plating of electrically conductive material such as e.g. copper onto the sputtered seed metal layer 718. In other words, the conductive pillar is 722 formed on the sputtered seed metal layer, which may also be referred to as the under bump metal, or the under pillar metal 718. It will also be appreciated that the walls of the conductive pillar 722 are not defined by an opening of a dielectric layer. Thus, it can be seen that the walls of the conductive pillar 722 do not abut a dielectric layer. The copper conductive pillar or bump 722 may further comprise a solder layer 724 formed at a tip of the pillar 722.

Figure 7I:
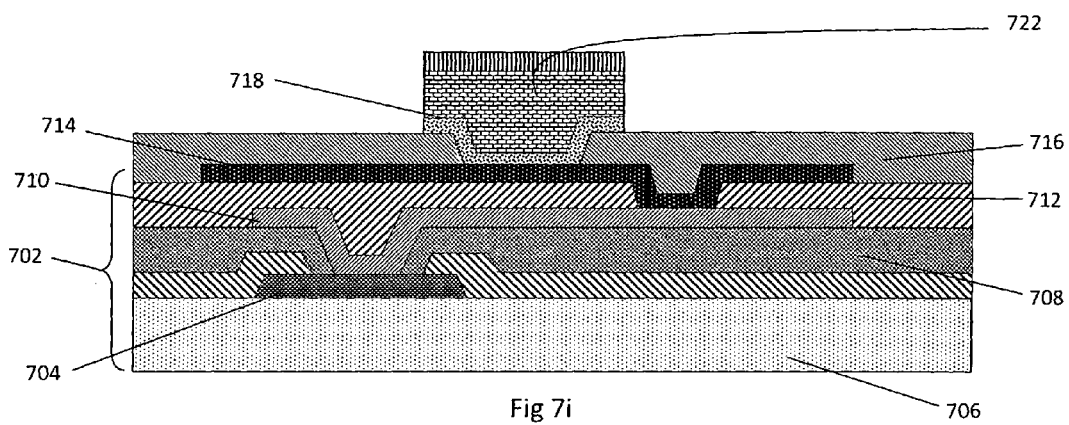

Finally, as shown in, FIG. 7i, the patterned photo resist layer 720 and portions of the seed metal layer 718 (not used by the conductive pillar 722) are removed by e.g. resist strip and etching processes respectively.

In the comparative example illustrated in FIG. 7i, the walls of the conductive pillar 722 are defined by the patterned photo resist layer 720, and sit directly on the seed metal layer 718 (or under bump/pillar metal). It will also be appreciated that the walls of the conductive pillar 722 are not defined by an opening of a dielectric layer. Thus, it can be seen that the walls of the conductive pillar 722 do not abut a dielectric layer.

Figure 8A:
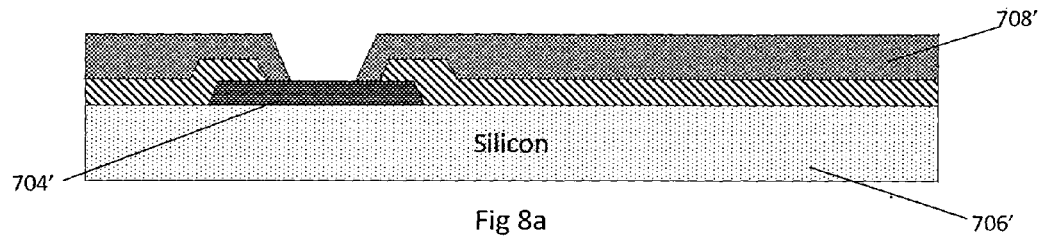
Figure 8B:
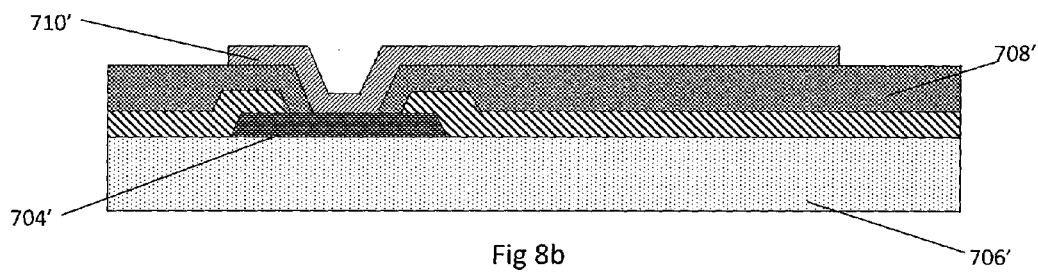
Figure 8C:
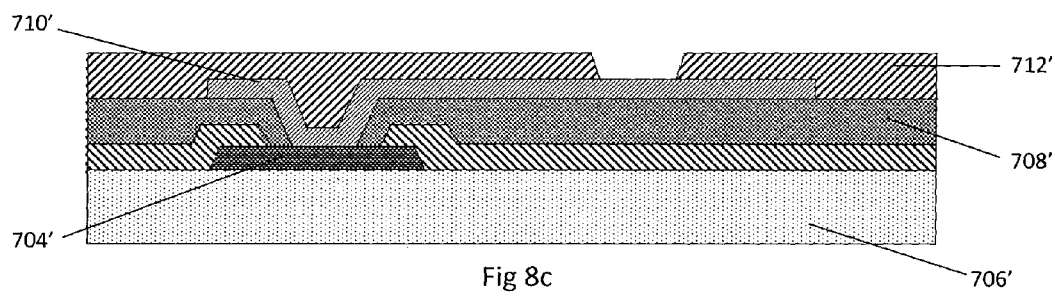
Figure 8D:
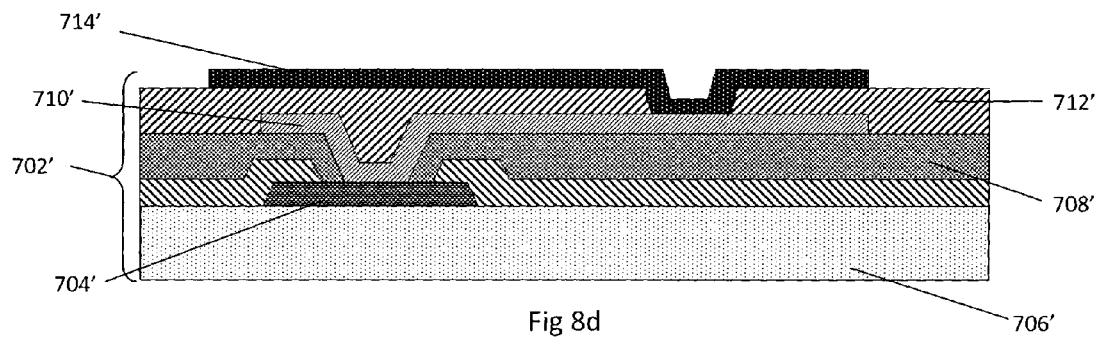
Figure 8I:
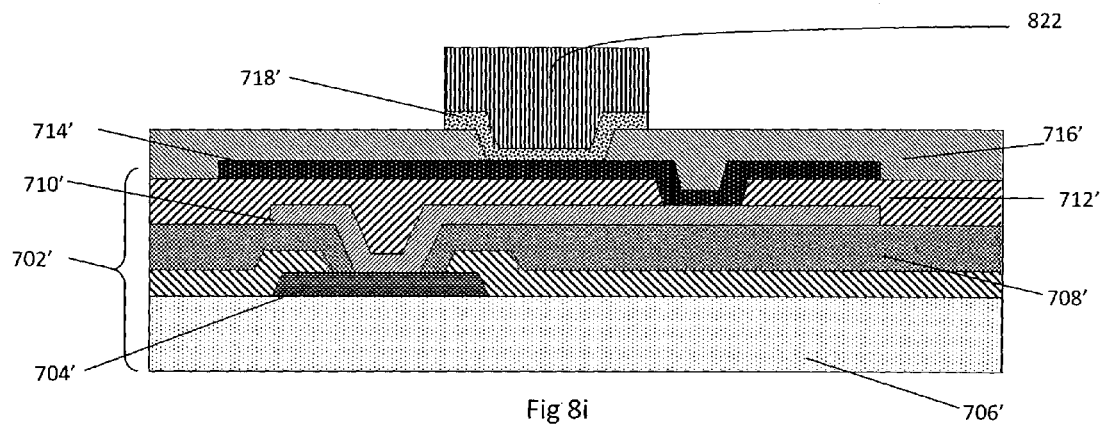

FIGS. 8a to 8j show a method for forming a conductive pillar on a substrate in a comparative example. The process shown in FIG. 8a to FIG. 8i is similar to that as described in FIGS. 7a to 7i above, and will not be described in further detail for conciseness. As the components shown in FIGS. 8a to 8i are similar to that shown in FIGS. 7a to 7i, like numerals are used but with a prime ' symbol for better distinguishability. In FIG. 8h, the conductive pillar 822 is formed by electrolytic plating of solder material. Thus, instead of having only solder material at the tip of the pillar (as in FIG. 7i), the conductive pillar 822 is substantially comprised of the solder material.

Figure 8J:
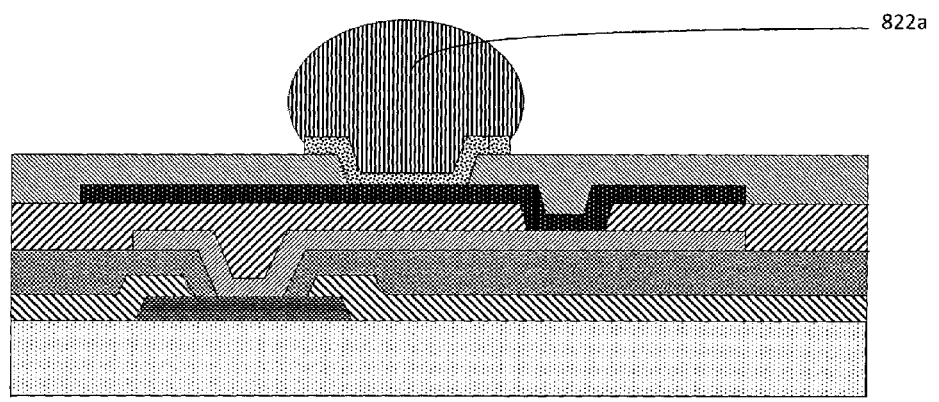

In addition to the steps described in FIGS. 7a to 7i, a further step is shown in FIG. 8j. In FIG. 8j, the integrated circuit structure has undergone a solder reflow process, and the walls of the bump or pillar are now no longer defined but are rounded, as the pillar 822a is made substantially from solder material which would melt during the solder reflow process.

Figure 8K:
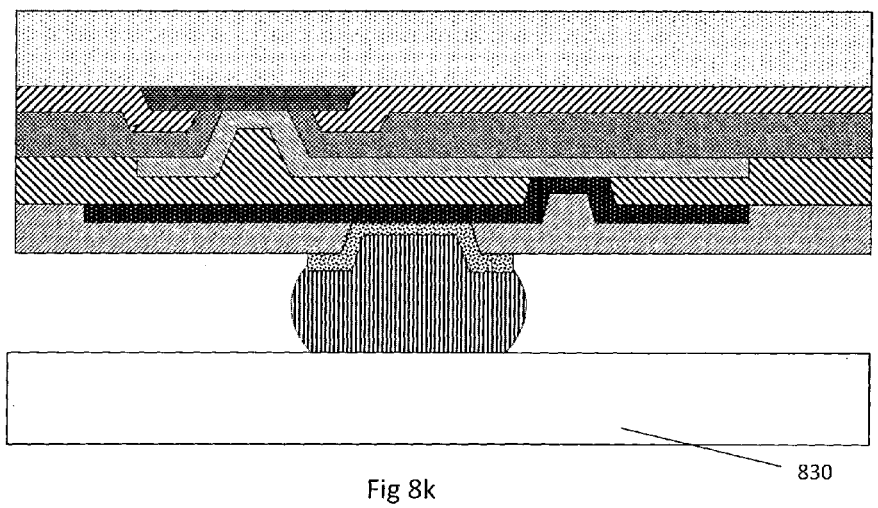

FIG. 8k shows the chip disclosed in FIG. 8j and that is flipped and bonded to a package substrate in the form of a Printed Circuit Board 830 through the bump after the solder reflow process.

In the comparative example illustrated in FIGS. 8j and 8k, the walls of the conductive pillar 822 are not defined and the walls of the conductive pillar 822 do not abut a dielectric layer. Further, the conductive pillar 822 sits directly on the seed metal layer 818 (or under bump/pillar metal).

In contrast with the comparative examples illustrated in FIGS. 7i and 8j, the example embodiment illustrated in e.g. FIGS. 3g and 3H of the present application show a conductive pillar 322, where the walls are defined by an opening dielectric layer 318 and a patterned photo resist layer 110a. It can be seen that the walls of the conductive pillar 322 abut at least a dielectric layer. In addition, the conductive pillar 322 can be formed directly on the RDL, and does not require the additional seed metal layer 510 (FIG. 5).

In addition, in contrast with the comparative example illustrated in FIG. 8j, in the example embodiments of the present disclosure, the walls of the conductive pillar are substantially straight. For example, FIG. 1f, 2g, 3h shows pillars 114, 218 and 322 respectively where the walls of the pillars may be formed by substantially straight lines when a sectional view of the pillar is taken. Further, in some embodiments, the walls of the pillar are substantially perpendicular to the substrate plane. In some embodiments, the walls of the pillars may comprise of one or more substantially straight sections. For example, as shown in pillar 420 and 422 of FIG. 4l, each wall 421a, 421b; 423a, 423b of the pillars 420; 422 respectively, comprises of at least two substantially straight sections connected together.

The example embodiments of the present application can advantageously provide for the formation of a conductive pillar formed on a substrate which is different from the comparative examples (FIGS. 5-8), in that the conductive pillar can be formed directly on a portion of the electrically conductive portion (e.g. the contact pad or a redistribution layer) of the substrate. In contrast, in the comparative examples (FIGS. 5-8), an under bump/pillar metal layer has to be formed over the electrically conductive portion of the substrate, before the conductive pillar can be formed directly on the under bump/pillar metal layer.

Accordingly, in some embodiments of the present disclosure, there is provided an integrated circuit structure that does not comprise or contain a UBM layer. Particularly, in some embodiments, the integrated circuit structure does not contain or comprise a diffusion barrier layer between the conductive pillar and the electrically conductive portion of the substrate.

It will be appreciated that in not requiring an under bump/pillar metal layer for the formation of the conductive pillar, example embodiments of the present application can advantageously reduce the process cycle time, as the steps of sputtering the under bump/pillar metal and the subsequent removal of seed layer at sections where it is not required will no longer be needed. This can also bring about cost savings.

The comparative examples which require the under bump/pillar metal layers also require the removal of the sputtered seed layer, at sections where it is not needed. However, it will be appreciated that the etching away of the seed layer can be imprecise and result in portions of the under bump/pillar metal layer to be removed together with the undesired sections of the sputtered seed layer. This can cause adhesion issues of the UBM which in turn leads to adhesion problems of the pillar. Such problems can potentially be avoided by embodiments of the present disclosure.

In addition, in example embodiments of the present application, not more than one photo mask is needed for the formation of the opening in the patterned layer (see for e.g. 110a, 214a, 318a and 414a in FIGS. 1d, 2f, 3f, and 4i respectively) and the opening in the dielectric layer (see for e.g. 108, 212, 316 and 412 in FIG. 1d, 2f, 3f, 4j respectively). Thus, the process cycle time can be further reduced, with associated cost savings. It will also be appreciated that the reduction in the photo masks used can also result in reduced the cost of wafer fabrication. In contrast, in the comparative examples, at least two different photo masks have to be used for the formation of the patterned layer (see for e.g. 512, 612, 720, and 720' in FIGS. 5f, 6, 7g and 8g respectively) and the dielectric layer (see for e.g. 508, 608, 716, 716' in FIGS. 5c, 6, 7e and 8e respectively).

Further, it will be appreciated that in using not more than one photo mask for both the patterned layer (see for e.g. 110a, 214a, 318a and 414a in FIGS. 1d, 2f, 3f, and 4j respectively) and the opening in the dielectric layer (see for e.g. 108, 212, 316 and 412 in FIG. 1d, 2f, 3f, 4j respectively), the opening in the dielectric layer (see for e.g. 108, 212, 316 and 412 in FIG. 1d, 2f, 3f, 4j respectively) can be substantially aligned with the respective apertures in the patterned layer (see for e.g. 110a, 214a, 318a and 414a in FIGS. 1d, 2f, 3f, and 4j respectively). This can advantageously maximise the contact area of the pillar and the underlying conductive portion (pad or RDL) and hence provide for higher adhesion strength performance of the pillar/bump.

Figure 9A:
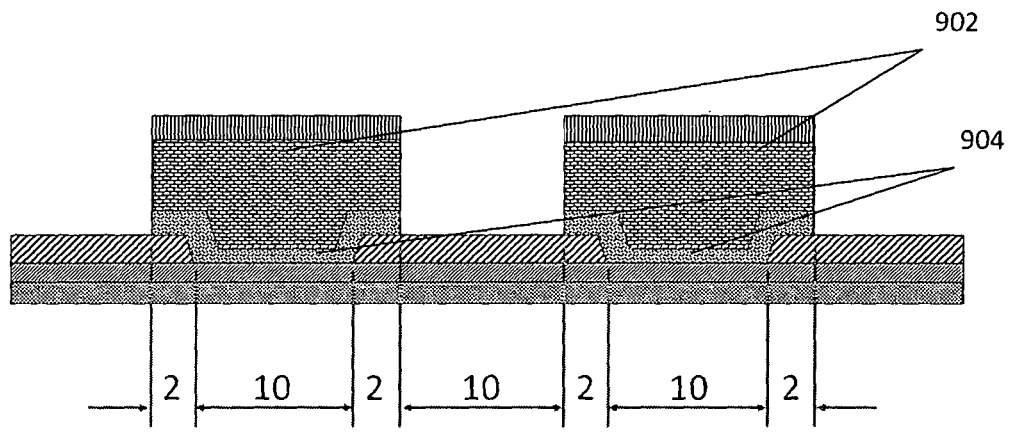
FIG. 9a shows a comparative example of the pitch size of a conductive pillar formed on a under bump/pillar metal.

With particular reference to the pillar structure 422 as shown in FIG. 4l, it will be appreciated that the patterned layer further comprises resist structures 416 as shown in FIG. 4k, in addition to the patterned metal layers 414a. Thus, in order to form the bump in via structure 422 a further mask may be required to form the resist structures 416. That is, in the two metal layer integrated circuit structure shown in FIG. 4l, the bump and via can be consolidated to form a bump in via structure 422, wherein the conductive pillar can be formed with or using no more than two masks, from a substrate comprising of the first metal layer 410.

pillar 902' formed directly on a conductive portion 906 of the die in an example embodiment. It will be appreciated that the under bump/pillar metal 904 would have to be bigger in size than the opening in the e.g. dielectric to provide mismatch tolerances in multilayer processing. As such, the size of the pillar 902 is limited by the size of the under bump/pillar metal 904. As seen in FIG. 9a, for a 10 μm via size with 10 μm spacing, the achievable pitch size is 24 μm. In contrast, in example embodiments of the present application, for the same 10 μm via size with 10 μm spacing, a pitch of 20 μm is achievable, which is a 4 μm reduction compared to the comparative example shown in FIG. 9b. Therefore, the example embodiments of the present application can also advantageously provide for a smaller pitch size in the absence of the under bump/pillar metal layer. In example embodiments of the present application, bump/pillar widths of 50 μm (microns) or less can be provided, which can in turn provide for pitch sizes of 50 μm (microns) or less.

In the example embodiment shown in FIGS. 4l to 4n, the bump-in-via structure 422, allows the bump to be formed directly from the first metal layer even though the integrated circuit structure is a two metal layer structure. In contrast with the comparative examples illustrated in FIGS. 7g and 8j, the respective pillars 722 and 822 are formed on the second RDL/metal layer. In other words, the example embodiments shown in FIGS. 4l to 4n allows the via and bump to be consolidated to allow for direct access of the inner routing lines (i.e. the first RDL/metal layer). This can advantageously shorten the electrical path for signal distribution and thus enhance the signal performance.

Table 1 below shows a comparison of the simplified wafer fabrication process for the formation of the integrated circuit structures described above. Specifically, the comparison of the fabrication processes of the integrated circuit structure comprising an electrically conductive pillar and two RDL/metal layers in the example embodiments of FIGS. 3a to 3h, FIGS. 4a to 4n, and the comparative example of FIGS. 7a to 7i above are shown in the table below.

TABLE 1

| Step | Example Embodiment of FIG. 4 (Bump-In-Via) | Example Embodiment of FIG. 3 (Resist Defined Bump) | Comparative Example of FIG. 7 |
| --- | --- | --- | --- |
| 1 | Wafer preparation | Wafer preparation | Wafer preparation |
| 2 | Photo process (Coat, imaging & strip) | Photo process (Coat, imaging & strip) | Photo process (Coat, imaging & strip) |
| 3 | Sputter seed layer - metal deposition | Sputter seed layer - metal deposition | Sputter seed layer - metal deposition |
| 4 | PR photo process | PR photo process | PR photo process |
| 5 | RDL plating (1 ML) | RDL plating | RDL plating (1 ML) |
| 6 | PR strip & Metal Etch | PR strip & Metal Etch | PR strip & Metal Etch |
| 7 | Dielectric Layer coated and metal deposited | PR photo process | PR photo process |
| 8 | RDL plating (2 ML) | Sputter seed layer - metal deposition | Sputter seed layer - metal deposition |
| 9 | Patterning of outer layer & Metal etch | PR photo process | PR photo process |
| 10 | Strip using metal mask | RDL plating (2 ML) | RDL plating (2 ML) |
| 11 | Photo process | PR strip & Metal Etch | PR strip & Metal Etch |
| 12 | Solder plating | Final dielectric and PR Photo process | PR photo process (Final dielectric) |
| 13 | Photo process | Copper pillar plating | UBM deposition |
| 14 | | PR strip | PR photo process |
| 15 | | | Solder plating |
| 16 | | | PR strip & UBM etch |

Figure 9B:
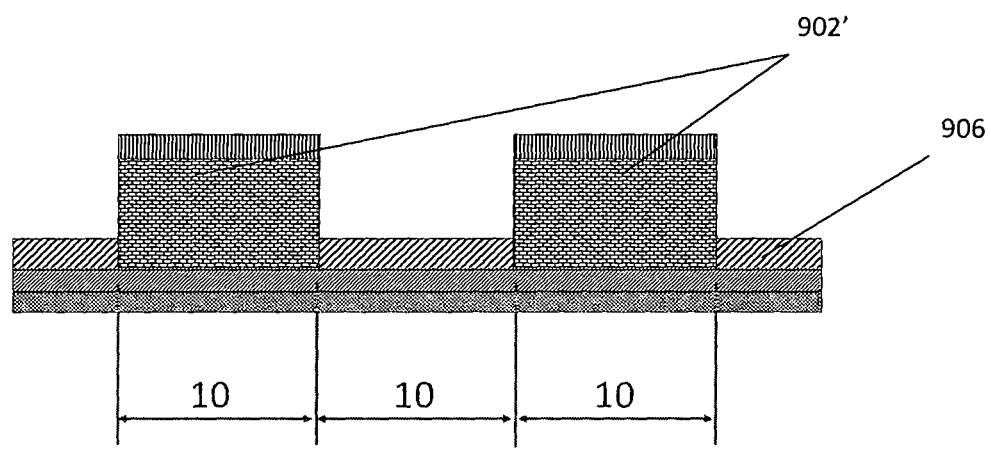
FIG. 9b shows the pitch size of a conductive pillar formed directly on a conductive portion of the die in an example embodiment.

FIG. 9a shows a comparative example of the pitch size of a conductive pillar 902 formed on a under bump/pillar metal (UBM) 904. FIG. 9b shows the pitch size of a conductive From Table 1, it is evident that there is a reduction in the number of process steps in the example embodiments of the present application compared with the comparative example requiring the UBM (under bump/pillar metal). In addition, as mentioned above, the number of masks required will also be reduced.

It will be appreciated by a skilled person reading the present disclosure that while the example embodiments disclosed in the foregoing describe integrated circuit structures as examples of multilayer structures on which the pillar is formed, the multilayer structure may include, and is not limited to, an interposer.

Figure 10:
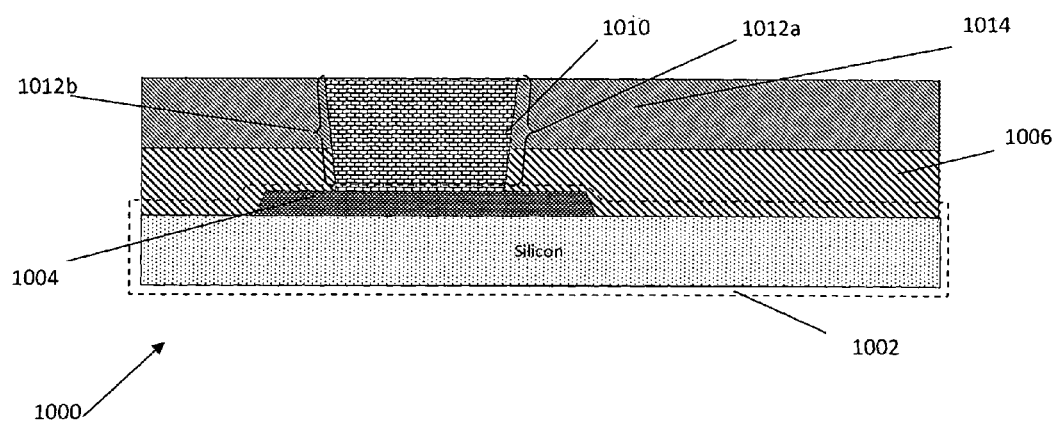
FIG. 10 shows a multilayer structure in accordance with some embodiments disclosed herein.

FIG. 10 shows a multilayer structure 1000 for a semiconductor device. The multilayer structure 1000 comprises a substrate 1002 having an electrically conductive portion 1004 thereon; a dielectric layer 1006 formed over the substrate 1002, the dielectric layer 1006 comprising an opening over at least part of the electrically conductive portion 1004; and a conductive pillar 1010 formed on the at least part of the electrically conductive portion 1004; wherein the conductive pillar 1010 comprises walls 1012a, 1012b defined by at least the opening of the dielectric layer 1006 and an opening of a patterned layer 1014. The patterned layer 1014 may or may not be present as part of final the multilayer structure 1000.

In one embodiment, the opening of the patterned layer is substantially aligned with the opening of the dielectric layer.

In one embodiment, the patterned layer comprises a resist layer.

In one embodiment, the patterned layer is a layer that has been removed.

In one embodiment, the patterned layer comprises a metal layer, such that said conductive pillar conductively connects the electrically conductive portion of the substrate to the metal layer.

In one embodiment, the patterned layer further comprises a resist layer.

In one embodiment, the resist layer has been removed.

In one embodiment, a solder layer is formed over the conductive pillar.

In one embodiment, the electrically conductive portion comprises a redistribution layer that is conductively connected to a contact pad.

In one embodiment, the walls of the conductive pillar are substantially straight.

In one embodiment, the electrically conductive portion comprises a contact pad.

In one embodiment, the conductive pillar comprises an electroplated metal that is electroplated from the electrically conductive portion.

In one embodiment, the conductive pillar formed on the at least part of the electrically conductive portion comprises a bump-in-via structure.

In one embodiment, the substrate comprises a wafer.

In one embodiment, the multilayer structure further comprises a package substrate coupled to the conductive pillar.

In one embodiment, a width of the pillar is 50 microns or less.

In one embodiment, the multilayer structure comprises an integrated circuit structure.

In one embodiment, the multilayer structure comprises an interposer.

Figure 11:
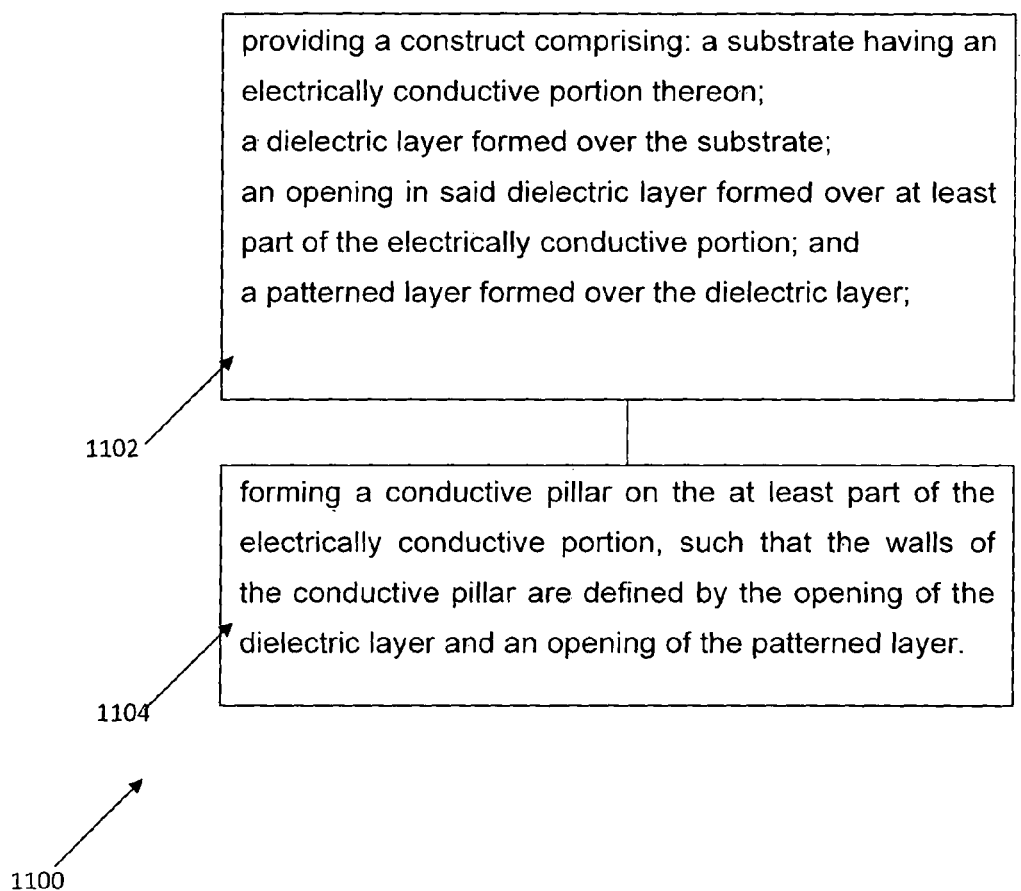
FIG. 11 shows a method for forming a multilayer structure in accordance with some embodiments disclosed herein.

FIG. 11 shows a method 1100 for forming a multilayer structure in an example embodiment. At step 1102, a construct is provided. The construct may comprise: a substrate having an electrically conductive portion thereon; a dielectric layer formed over the substrate; an opening in said dielectric layer formed over at least part of the electrically conductive portion; and a patterned layer formed over the dielectric layer. At step 1104, a conductive pillar is formed on the at least part of the electrically conductive portion, such that the walls of the conductive pillar are defined by the opening of the dielectric layer and an opening of the patterned layer.

In one embodiment, the walls of the conductive pillar are substantially straight.

In one embodiment, the step of providing the construct comprises: forming the substrate having the electrically conductive portion thereon; depositing the dielectric layer over the substrate; introducing the patterned layer over the dielectric layer; and etching a portion of the dielectric layer to form the opening over the at least part of the electrically conductive portion.

In one embodiment, the step of depositing the dielectric layer over the substrate comprises coating the dielectric layer on the substrate.

In one embodiment, the step of introducing the patterned layer comprises: depositing a resist layer on the dielectric layer; and patterning the resist layer through a selective etching process to form the opening of the patterned layer.

In one embodiment, the steps from introducing the patterned layer and to etching a portion of the dielectric layer to form the opening of the dielectric layer comprise using no more than one mask.

In one embodiment, the method further comprises the step of removing the patterned layer.

In one embodiment, the step of introducing the patterned layer comprises: depositing a metal layer, such that said conductive pillar electrically connects the electrically conductive portion of the substrate to the metal layer; and patterning the metal layer through a selective etching process to form the opening of the patterned layer.

In one embodiment, the steps from introducing the patterned layer to etching a portion of the dielectric layer to form the opening of the dielectric layer comprise using no more than one mask.

In one embodiment, the step of forming the patterned layer further comprises forming a resist layer on the metal layer.

In one embodiment, the method further comprises the step of removing the resist layer that is on the metal layer.

In one embodiment, the steps from introducing the patterned layer and to etching a portion of the dielectric layer to form the opening of the dielectric layer comprises using no more than two masks.

In one embodiment, the method further comprises the step of forming a solder layer over the conductive pillar.

In one embodiment, the step of forming a substrate having an electrically conductive portion thereon comprises sputtering a seed layer to form a redistribution layer, such that the redistribution layer forms the electrically conductive portion.

In one embodiment, the electrically conductive portion comprises a contact pad thereon.

In one embodiment, the step of forming the conductive pillar comprises electroplating the electrically conductive portion.

In one embodiment, the method further comprises coupling the conductive pillar to a package substrate.

In one embodiment, the step of forming the conductive pillar on the at least part of the electrically conductive portion comprises forming the pillar with a width that is 50 microns or less.

In one embodiment, the opening of the patterned layer is substantially aligned with the opening of the dielectric layer.

In one embodiment, the multilayer structure comprises an integrated circuit structure.

In one embodiment, the multilayer structure comprises an interposer.

In some embodiments, the patterned layer is an outermost layer of the multilayer structure.

It will be appreciated that in the forgoing disclosure when the use of resist masks is described, the use of either a positive or negative resist mask can be employed where applicable.

It will be appreciated by a person skilled in the art that other variations and/or modifications may be made to the embodiments disclosed herein without departing from the spirit or scope of the disclosure as broadly described. The present embodiments are, therefore, to be considered in all respects to be illustrative and not restrictive.

The invention claimed is:

1. A multilayer structure for a semiconductor device, the multilayer structure comprising:
    a substrate having an electrically conductive portion thereon;
    a photoimagable dielectric layer formed over the substrate;
    the dielectric layer comprising an opening over at least part of the electrically conductive portion; and
    a conductive pillar formed on the at least part of the electrically conductive portion;
    wherein the conductive pillar comprises walls defined by the opening of the dielectric layer and an opening of a photoimagable patterned layer, where the walls are in contact with the dielectric layer and the patterned layer, a top substantially flush with a top surface of the patterned layer, such that the conductive pillar is of a size which is substantially equal to combined sizes of the opening of the dielectric layer and the opening of the patterned layer;
    said patterned layer formed over the dielectric layer and wherein the patterned layer has been removed.

2. The multilayer structure as claimed in claim 1, wherein the patterned layer is an outermost layer of the multilayer structure, such that the conductive pillar is an outermost conductive pillar protruding above the dielectric layer upon removal of the patterned layer.

3. The multilayer structure as claimed in claim 1, wherein the opening of the dielectric layer is formed by a photo mask.

4. The multilayer structure as claimed in claim 1, wherein the opening of the patterned layer is substantially aligned with the opening of the dielectric layer.

5. The multilayer structure as claimed in claim 1, wherein the opening of the patterned layer and the opening of the dielectric layer are formed by a same photo mask.

6. The multilayer structure as claimed in claim 1, wherein the patterned layer comprises a resist layer.

7. The multilayer structure as claimed in claim 1, further comprising a solder layer formed over the conductive pillar.

8. The multilayer structure as claimed in claim 1, wherein the electrically conductive portion comprises a redistribution layer that is conductively connected to a contact pad.

9. The multilayer structure as claimed in claim 1, wherein walls of the conductive pillar are substantially straight.

10. The multilayer structure as claimed in claim 1, wherein the electrically conductive portion comprises a contact pad.

11. The multilayer structure as claimed in claim 1, wherein the conductive pillar comprises an electroplated metal that is electroplated from the electrically conductive portion.

12. The multilayer structure as claimed in claim 1, wherein the conductive pillar formed on the at least part of the electrically conductive portion comprises a bump-in-via structure.

13. The multilayer structure as claimed in claim, 1 wherein the substrate comprises a wafer.

14. The multilayer structure as claimed in claim 1, further comprising a package substrate coupled to the conductive pillar.

15. The multilayer structure as claimed in claim 1, wherein a width of the pillar is 50 microns or less.

16. The multilayer structure as claimed in claim 1, wherein the multilayer structure comprises an integrated circuit structure.

17. The multilayer structure as claimed in claim 1, wherein the multilayer structure comprises an interposer.

18. A method of forming a multilayer structure for a semiconductor device, the method comprising:
    providing a construct comprising:
        a substrate having an electrically conductive portion thereon;
        a photoimagable dielectric layer that is formed over the substrate;
        an opening in said dielectric layer that is formed over at least part of the electrically conductive portion; and
        a photoimagable patterned layer that is formed over the dielectric layer;
    forming a conductive pillar on the at least part of the electrically conductive portion, such that the walls of the conductive pillar are defined by the opening of the dielectric layer and an opening of the patterned layer, the walls in contact with the dielectric layer and the patterned layer, a top of the conductive pillar substantially flush with a top surface of the patterned layer, such that the conductive pillar is of a size which is substantially equal to combined sizes of the opening of the dielectric layer and the opening of the patterned layer; and removing the patterned layer.

19. The method as claimed in claim 18, wherein the patterned layer is an outermost layer of the multilayer structure, such that the conductive pillar is an outermost conductive pillar protruding above the dielectric layer upon removal of the patterned layer.

20. The method as claimed in claim 18, wherein the walls of the conductive pillar are substantially straight.

21. The method as claimed in claim 18, wherein the step of providing the construct comprises:
    forming the substrate having the electrically conductive portion thereon;
    depositing the dielectric layer over the substrate;
    introducing the patterned layer over the dielectric layer; and
    removing a portion of the dielectric layer to form the opening over the at least part of the electrically conductive portion.

22. The method as claimed in claim 21, wherein removing the portion of the dielectric layer to form the opening comprises using a photo mask.

23. The method as claimed in claim 21, wherein the step of depositing the dielectric layer over the substrate comprises coating the dielectric layer on the substrate.

24. The method as claimed in claim 21, wherein the step of introducing the patterned layer comprises:
    depositing a resist layer on the dielectric layer; and
    patterning the resist layer through a photolithography process to form the opening of the patterned layer.

25. The method as claimed in claim 21, wherein the steps from introducing the patterned layer and to removing a portion of the dielectric layer to form the opening of the dielectric layer comprise using no more than one mask.

26. The method as claimed in claim 21, wherein introducing the patterned layer and removing a portion of the dielectric layer to form the opening of the dielectric layer comprise using a same mask.

27. The method as claimed in claim 21, further comprising the step of forming a solder layer over the conductive pillar.

28. The method as claimed in claim 18, wherein the step of forming a substrate having an electrically conductive portion thereon comprises sputtering a seed layer to form a redistribution layer, such that the redistribution layer forms the electrically conductive portion.

29. The method as claimed in claim 18, wherein the electrically conductive portion comprises a contact pad thereon.

30. The method as claimed in claim 18, wherein forming the conductive pillar comprises electroplating the electrically conductive portion.

31. The method as claimed in claim 18, further comprises coupling the conductive pillar to a package substrate.

32. The method as claimed in claim 18, wherein forming the conductive pillar on the at least part of the electrically conductive portion comprises forming the pillar with a width that is 50 microns or less.

33. The method as claimed in claim 18, wherein the opening of the patterned layer is substantially aligned with the opening of the dielectric layer.

34. The method as claimed in claim 18, wherein the multilayer structure comprises an integrated circuit structure.

35. The method as claimed in claim 18, wherein the multilayer structure comprises an interposer.

* * * * *